(12) United States Patent
Watanabe

(10) Patent No.: US 7,884,008 B2
(45) Date of Patent: Feb. 8, 2011

(54) SEMICONDUCTOR DEVICE FABRICATION METHOD

(75) Inventor: Kiyonori Watanabe, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/489,544

(22) Filed: Jun. 23, 2009

(65) Prior Publication Data

US 2009/0258486 A1    Oct. 15, 2009

Related U.S. Application Data

(62) Division of application No. 11/294,502, filed on Dec. 6, 2005, now Pat. No. 7,582,972.

(30) Foreign Application Priority Data

Dec. 24, 2004    (JP) .............................. 2004-372615

(51) Int. Cl.
*H01L 23/52* (2006.01)
*H01L 23/48* (2006.01)
(52) U.S. Cl. .................. 438/614; 438/613; 438/629; 438/637; 438/639; 438/672; 438/687; 257/737; 257/738; 257/774; 257/781; 257/780; 257/786
(58) Field of Classification Search ............... 438/613, 438/614, 629, 637, 639, 672, 687; 257/737, 257/738, 774, 781, 780, 786
See application file for complete search history.

(56) References Cited

U.S. PATENT DOCUMENTS 6,103,552 A    8/2000   Lin

| 6,362,087 | B1 | 3/2002 | Wang et al. |
| 6,621,164 | B2 | 9/2003 | Hwang et al. |
| 6,835,595 | B1 | 12/2004 | Suzuki et al. |
| 2002/0076908 | A1* | 6/2002 | Makino et al. ............. 438/612 |
| 2003/0207574 | A1 | 11/2003 | Aiba et al. |

FOREIGN PATENT DOCUMENTS

| JP | 11195665 | 7/1999 |
| JP | 2003060120 | 2/2003 |
| JP | 2004022898 A | 1/2004 |

* cited by examiner

*Primary Examiner*—Kenneth A Parker
*Assistant Examiner*—Joseph Nguyen
(74) *Attorney, Agent, or Firm*—Volentine & Whitt, P.L.L.C.

(57) ABSTRACT

A method of forming a semiconductor device including a semiconductor substrate with circuit elements and electrode pads formed on one surface. This surface is covered by a dielectric layer with openings above the electrode pads. A metal layer is deposited on the dielectric layer and patterned to form a conductive pattern with traces leading to the electrode pads. A protective layer having openings exposing part of the conductive pattern is formed. Each opening is covered by an electrode such as a solder bump, which is electrically connected through the conductive pattern to one of the electrode pads. The method enables the thickness of the protective layer, which may function as a package of the semiconductor device, to be reduced. The protective layer may be formed from a photosensitive material, simplifying the formation of the openings for the electrodes.

11 Claims, 21 Drawing Sheets

(P1)

(P2)

(P3)

(P4)

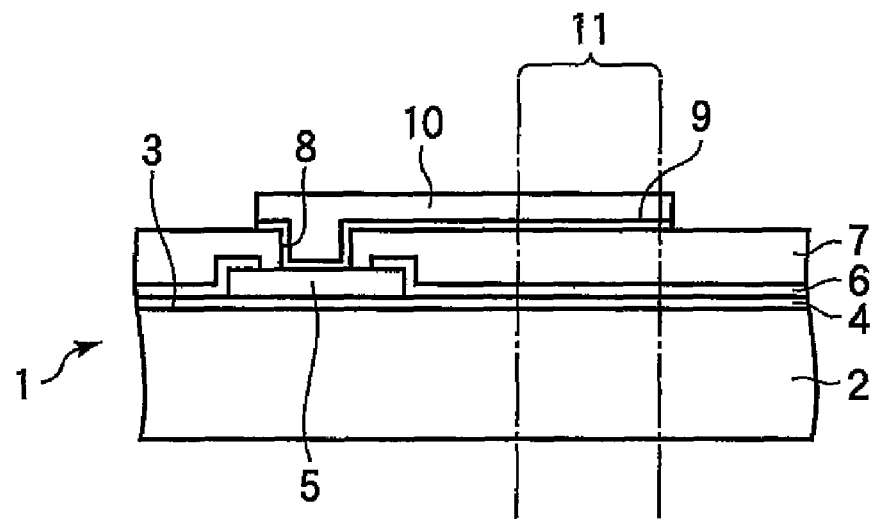
FIG. 5 (P5)
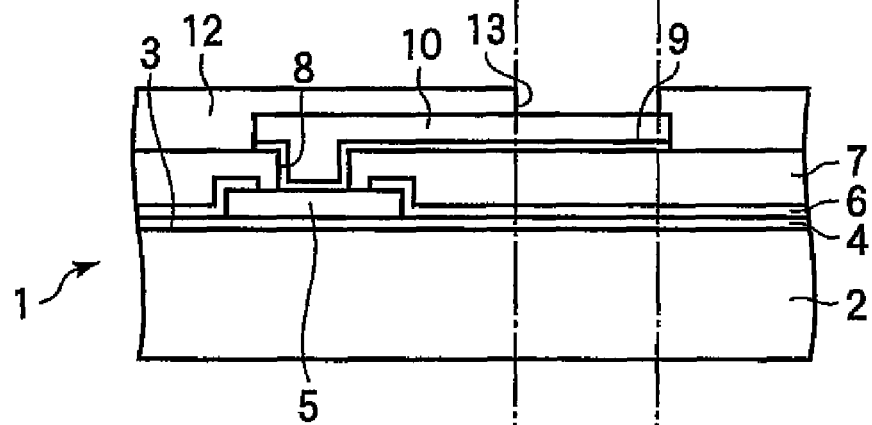
FIG. 6 (P6)
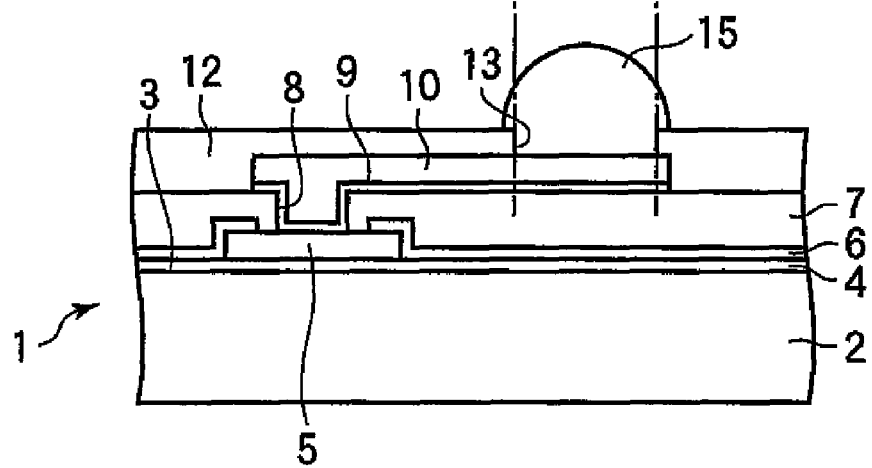
FIG. 7 (P7)

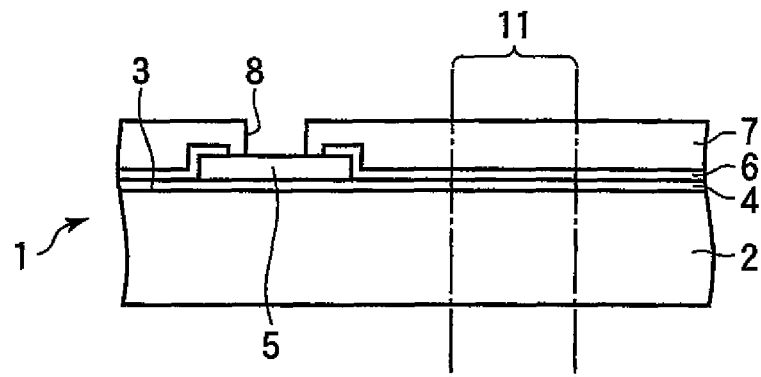
FIG.8 (PA1)
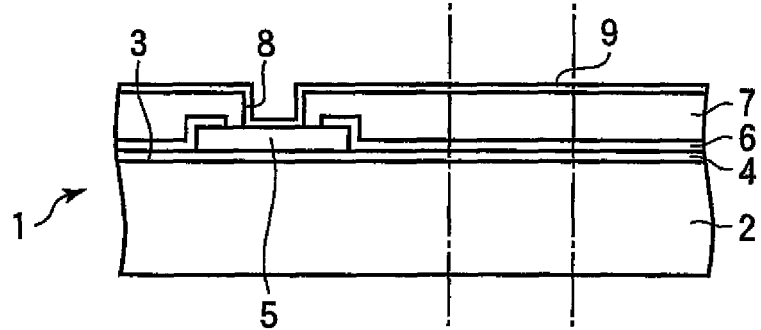
FIG.9 (PA2)
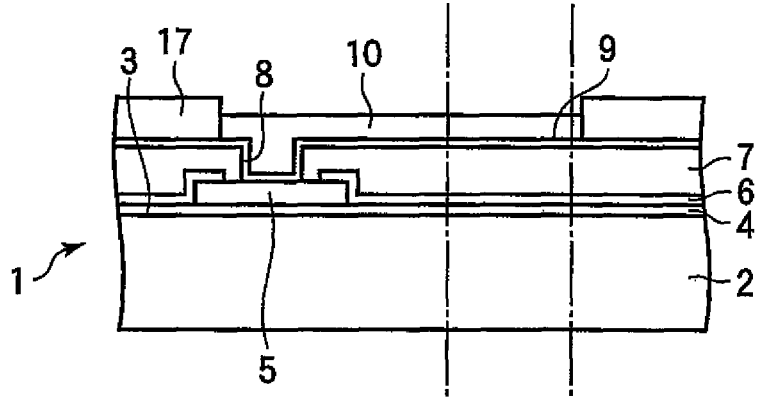
FIG.10 (PA3)
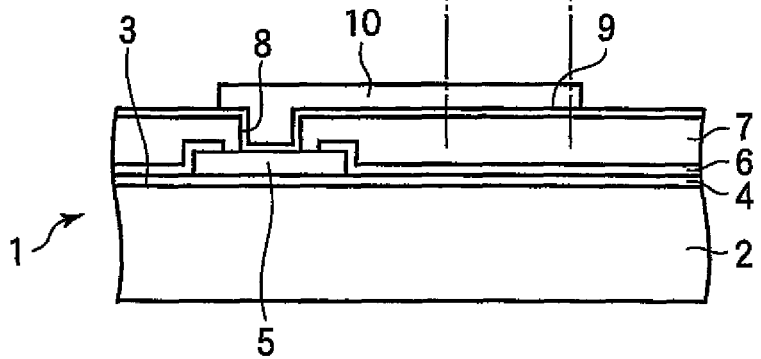
FIG.11 (PA4)

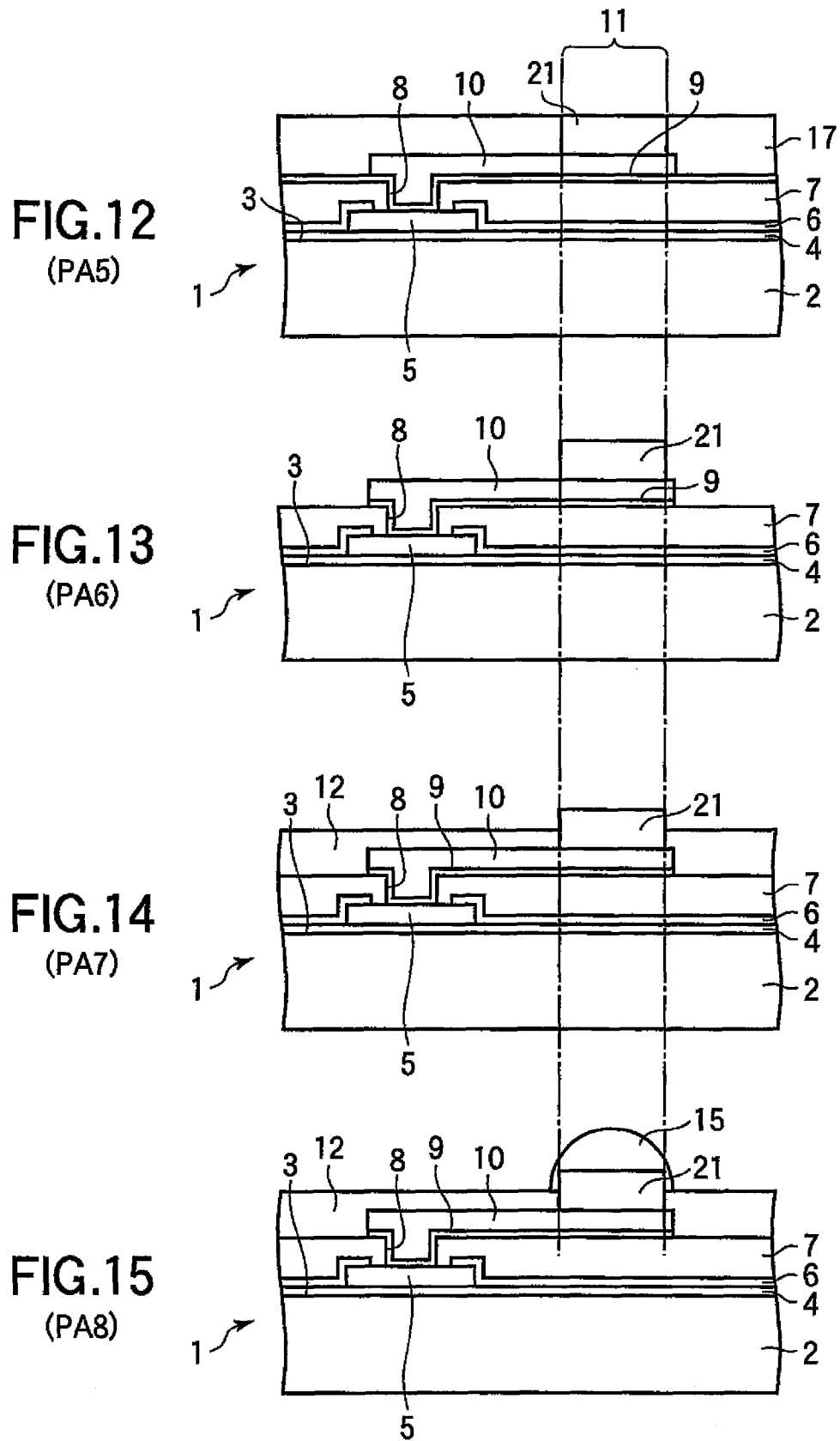
FIG.12 (PA5)
FIG.13 (PA6)
FIG.14 (PA7)
FIG.15 (PA8)

(PB1)

(PB2)

(PB3)

(PB4)

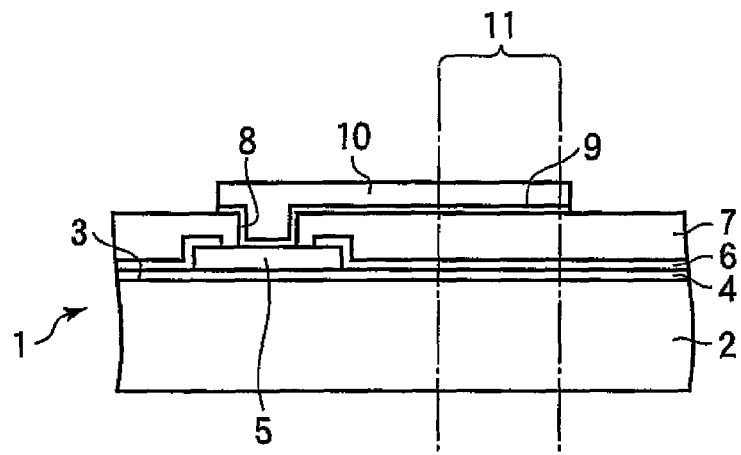
FIG.20 (PB5)
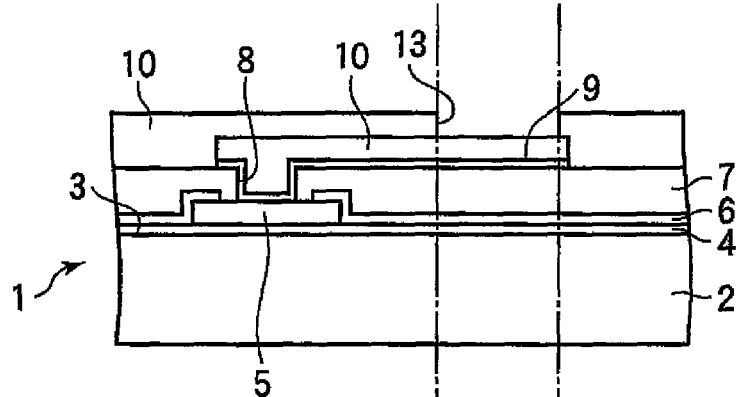
FIG.21 (PB6)
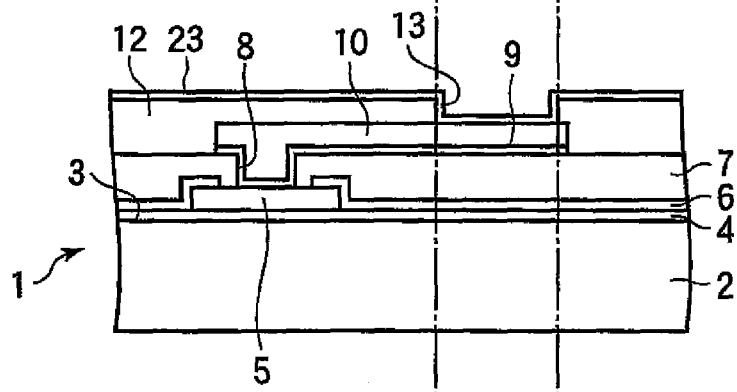
FIG.22 (PB7)
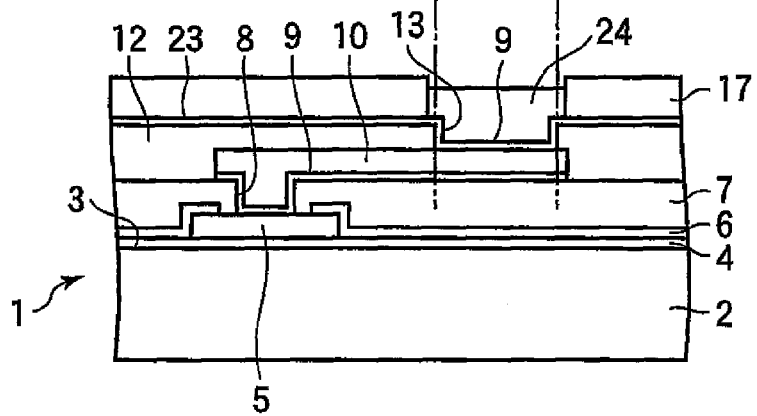
FIG.23 (PB8)

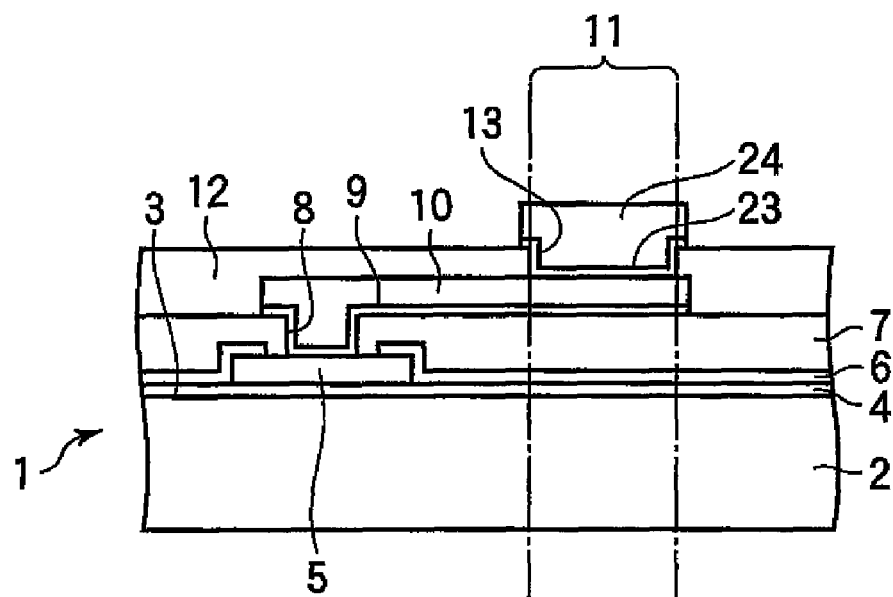
FIG. 24 (PB9)
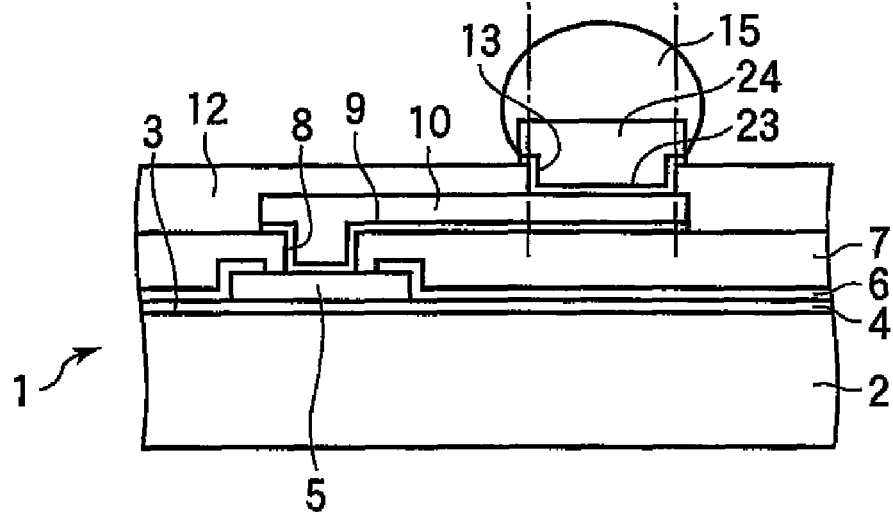
FIG. 25 (PB10)

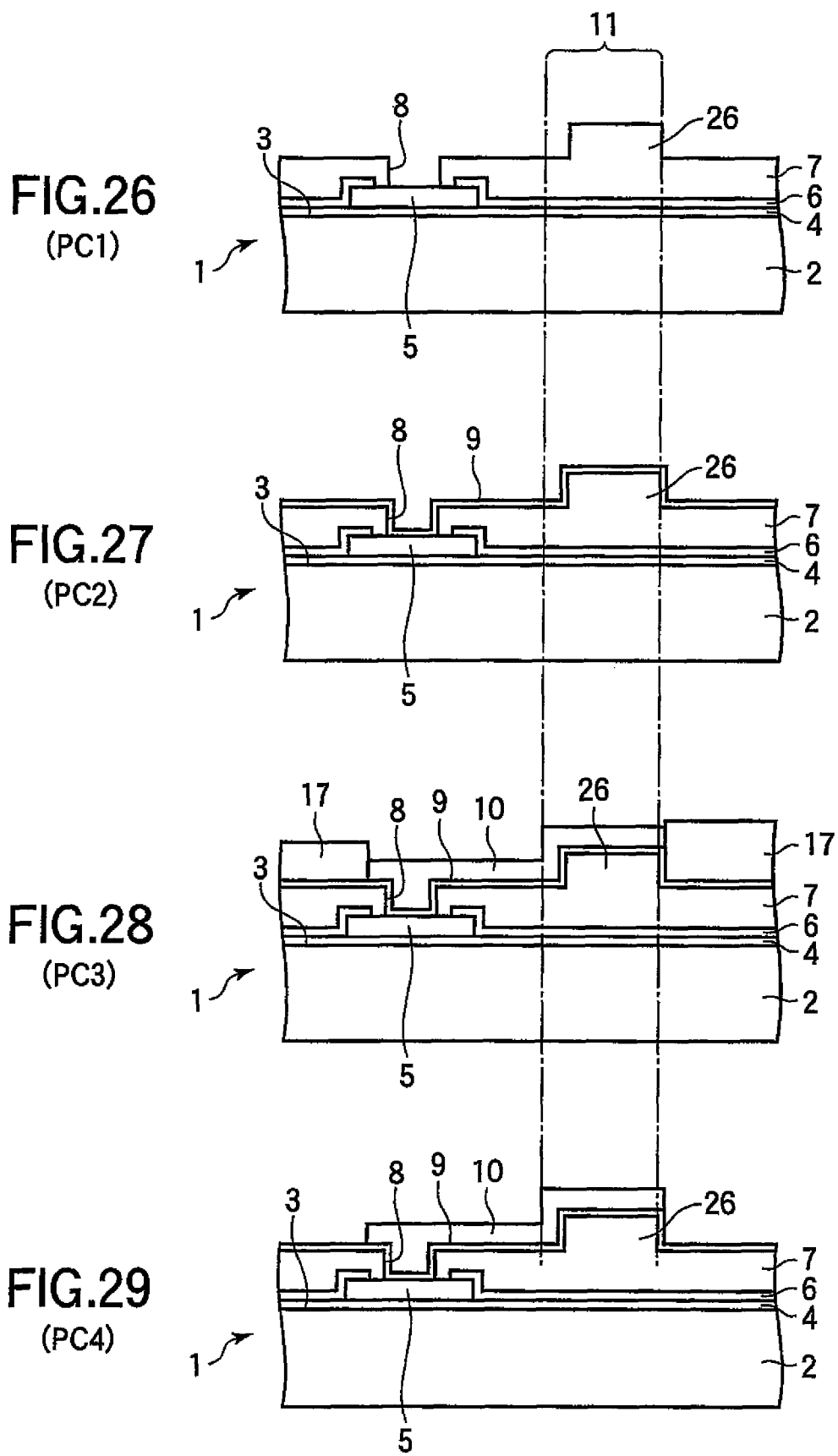

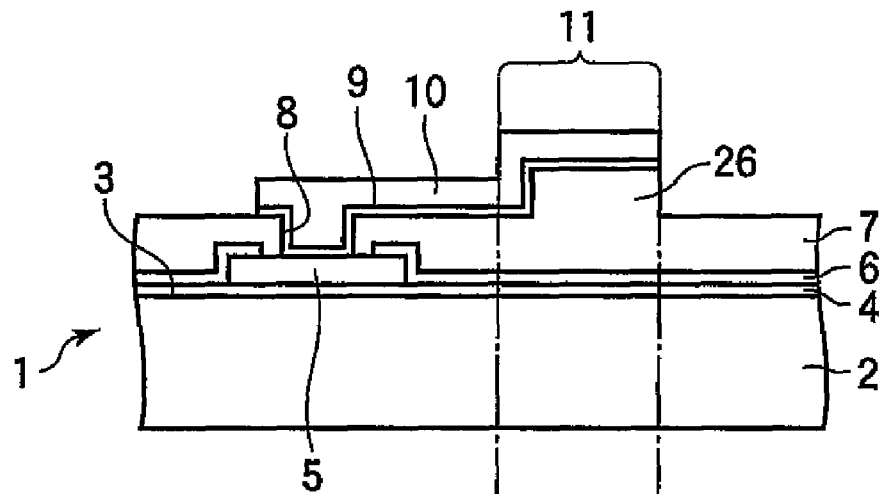
FIG. 30 (PC5)
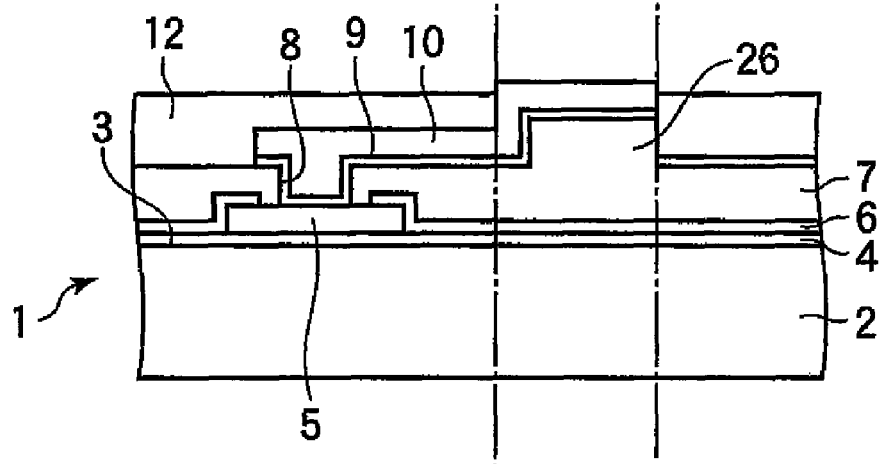
FIG. 31 (PC6)
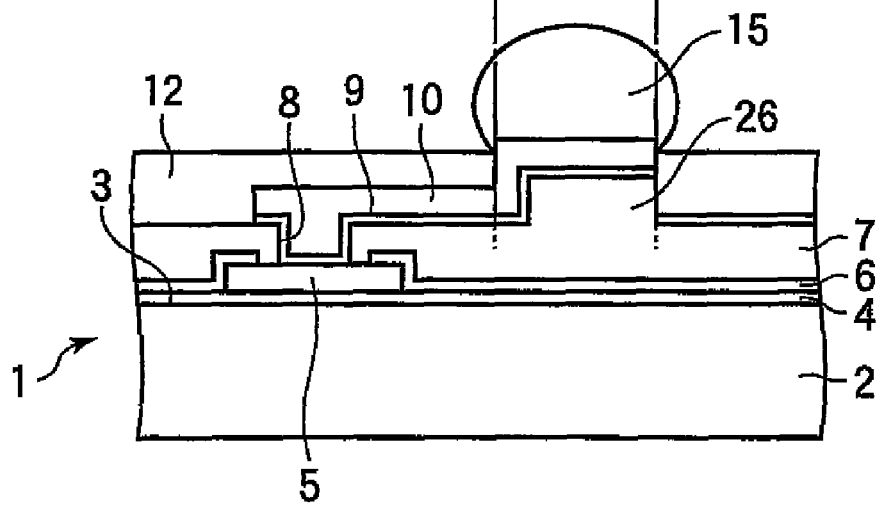
FIG. 32 (PC7)

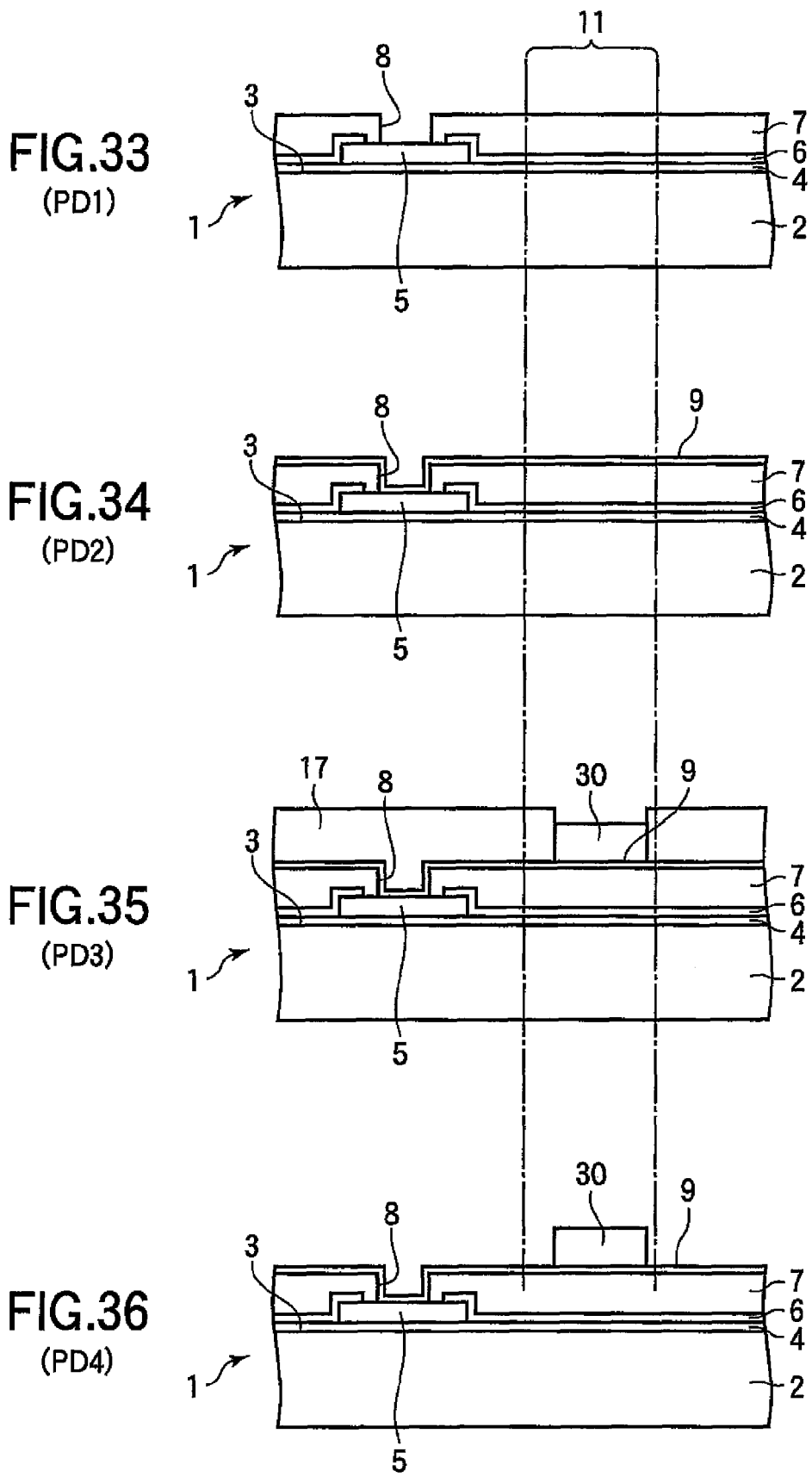

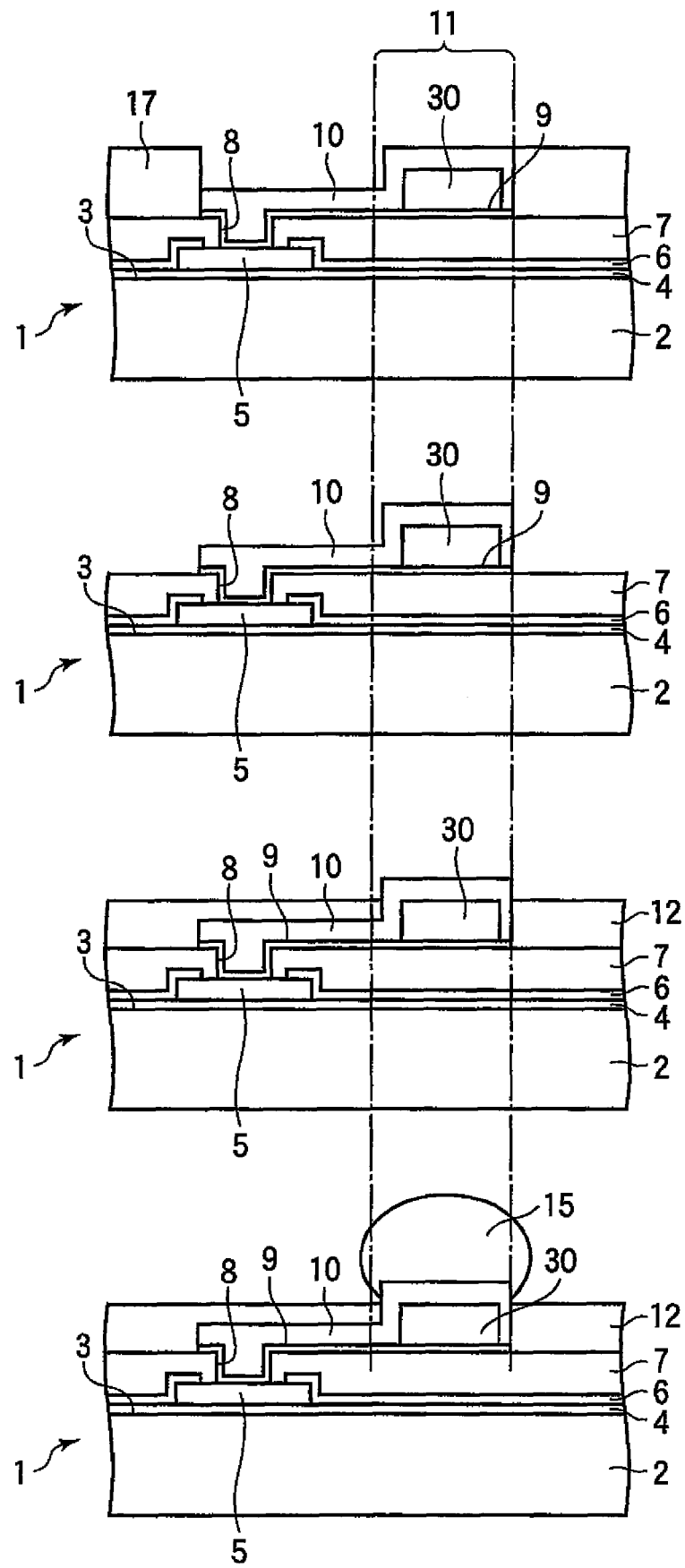
FIG.37 (PD5)
FIG.38 (PD6)
FIG.39 (PD7)
FIG.40 (PD8)

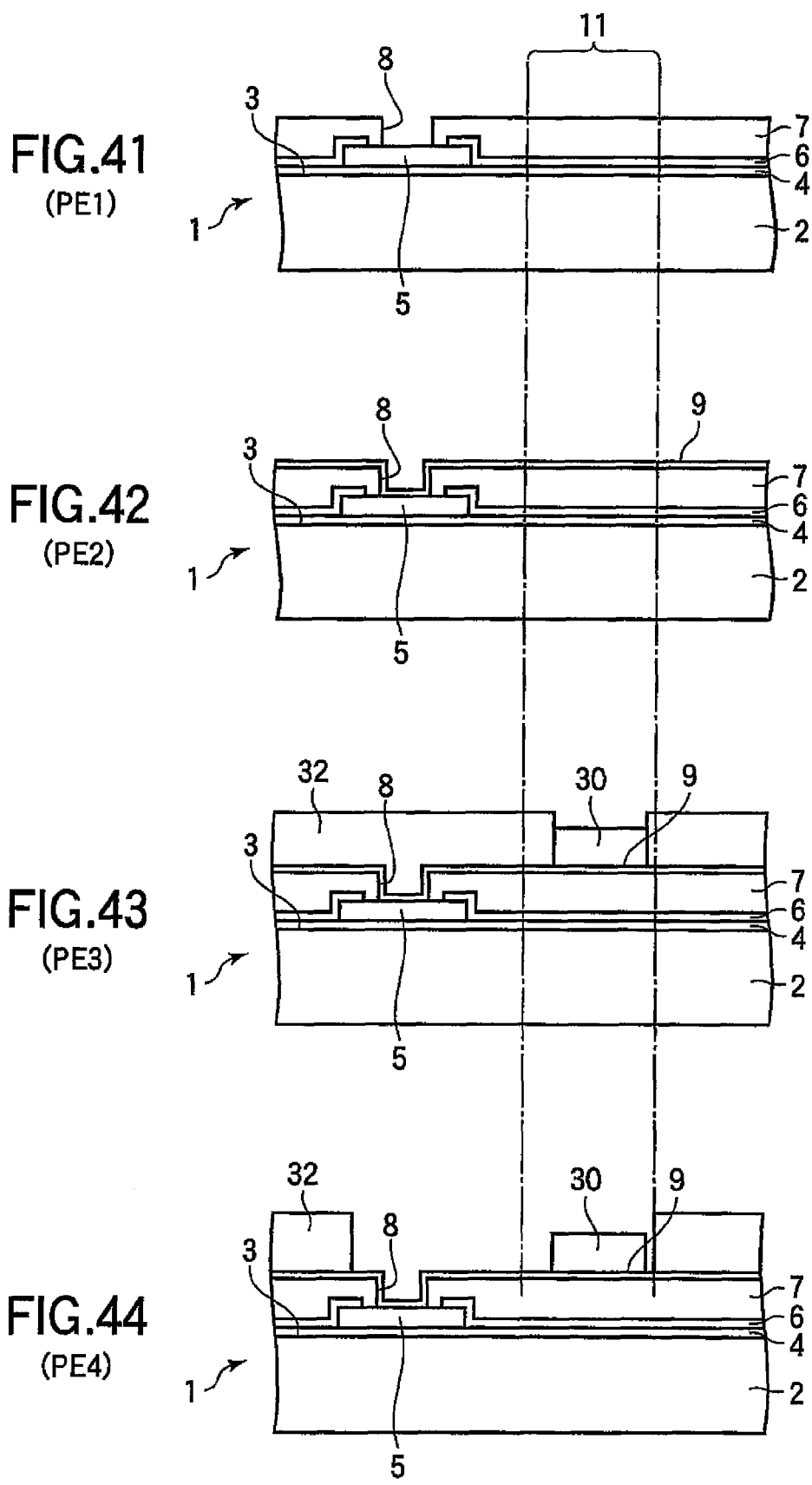

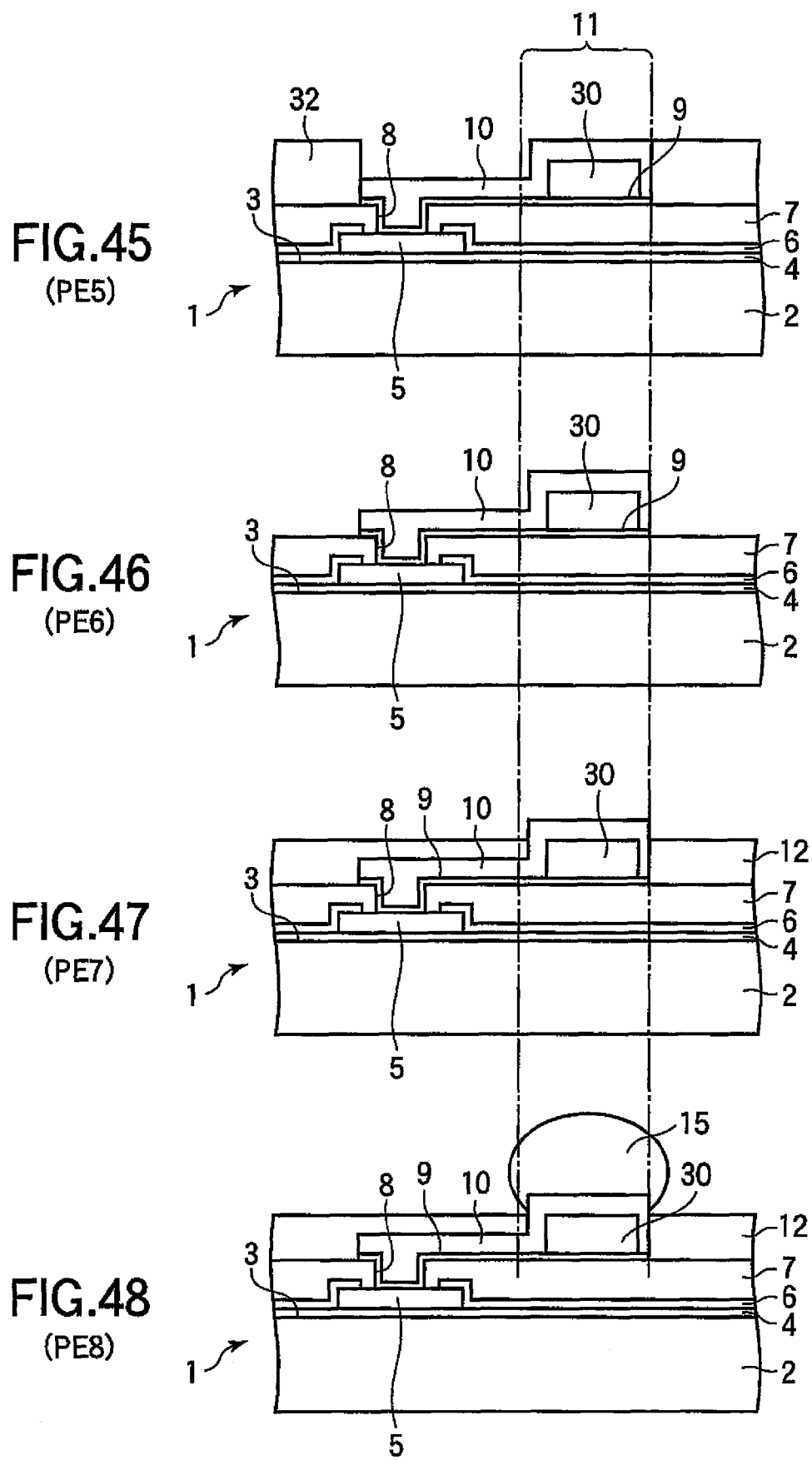
FIG.45 (PE5)
FIG.46 (PE6)
FIG.47 (PE7)
FIG.48 (PE8)

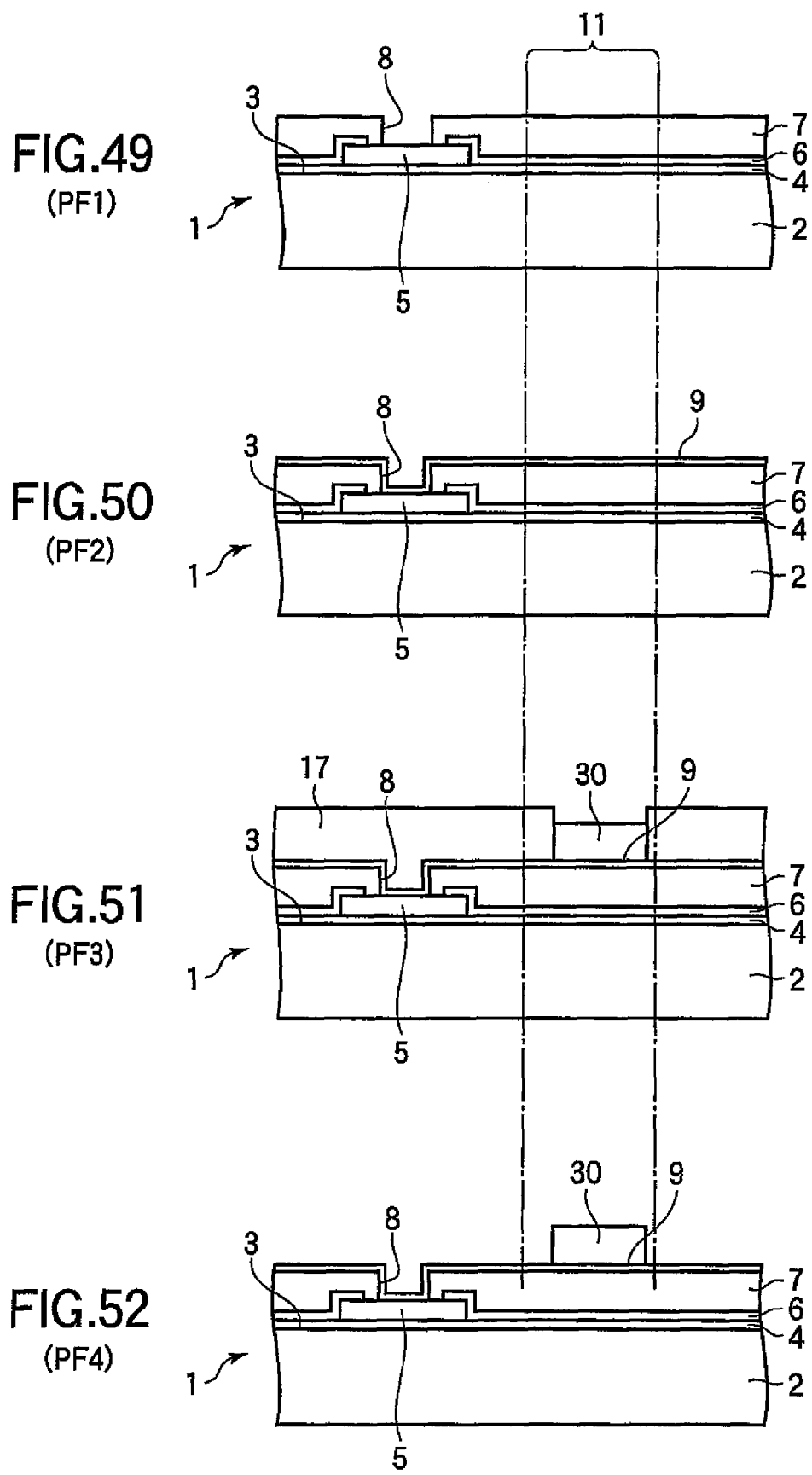
FIG. 49 (PF1)
FIG. 50 (PF2)
FIG. 51 (PF3)
FIG. 52 (PF4)

(PF5)

(PF6)

(PF7)

(PF8)

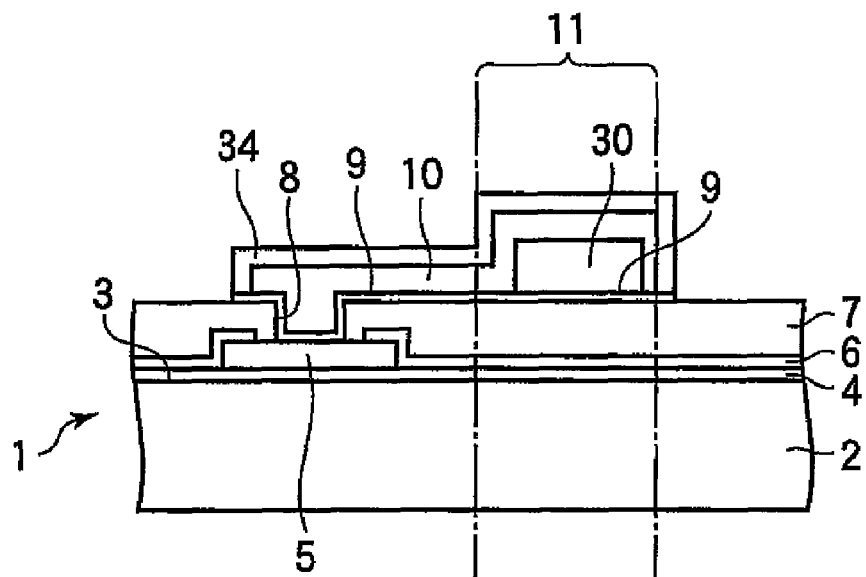
FIG.57 (PF9)
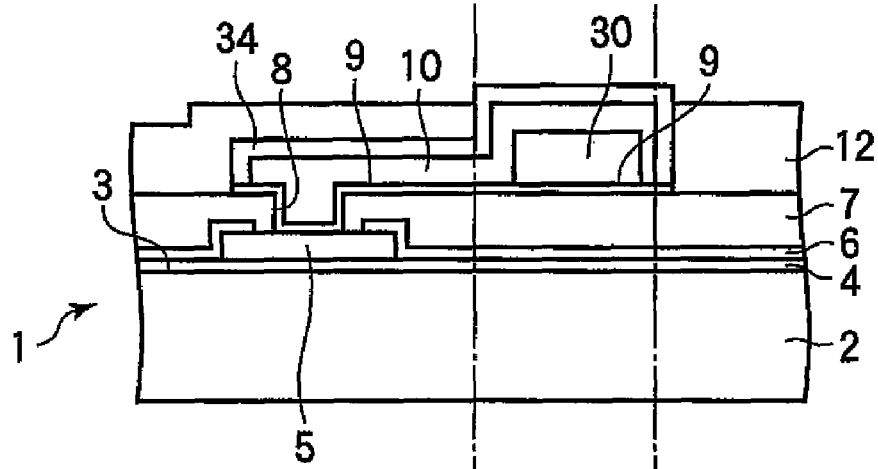
FIG.58 (PF10)
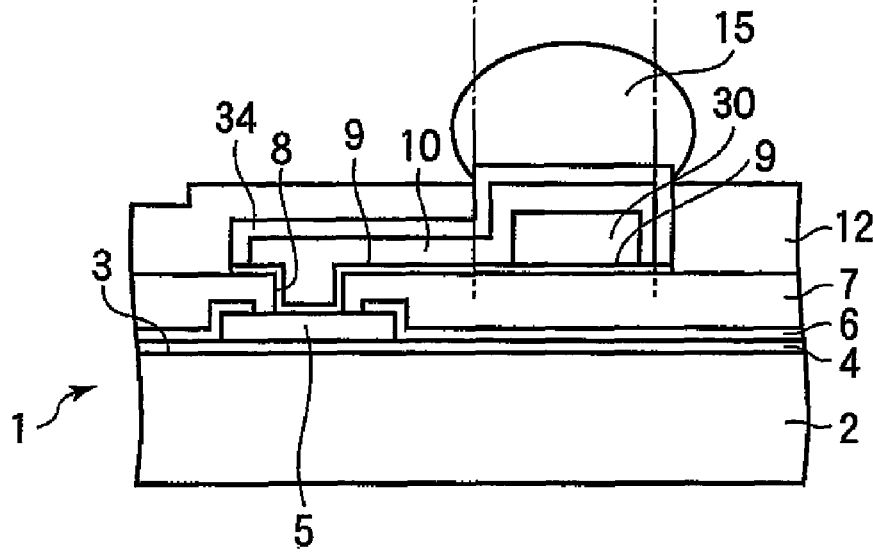
FIG.59 (PF11)

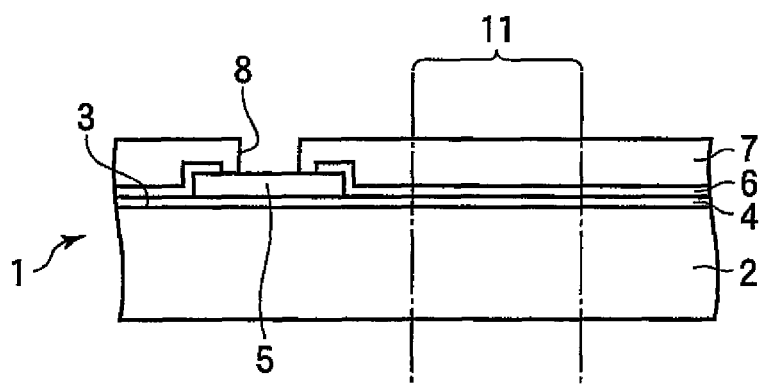
FIG. 60 (PG1)
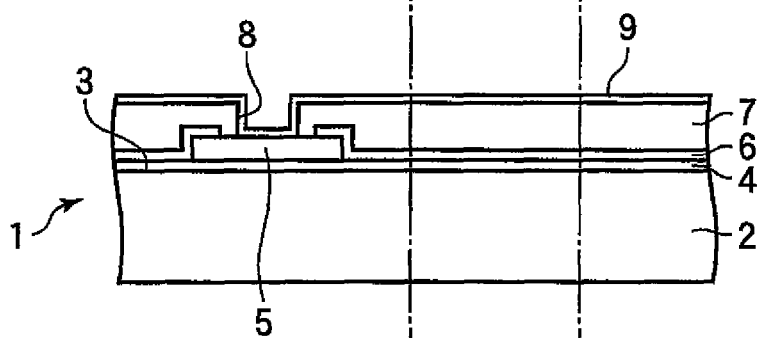
FIG. 61 (PG2)
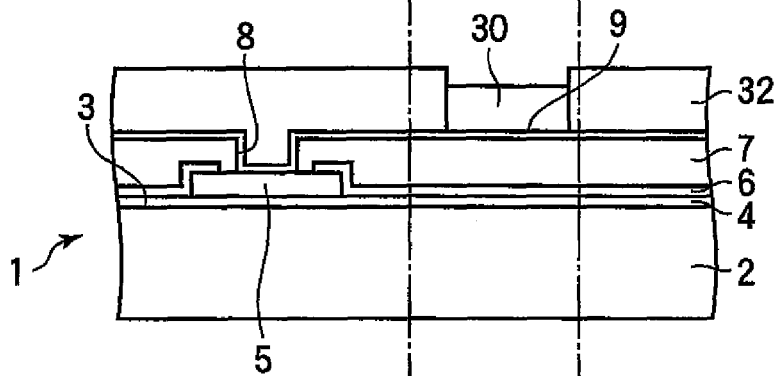
FIG. 62 (PG3)
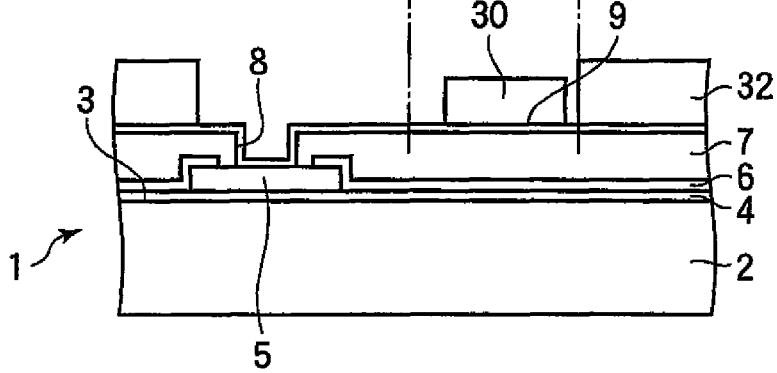
FIG. 63 (PG4)

(PG5)

(PG6)

(PG7)

(PG8)

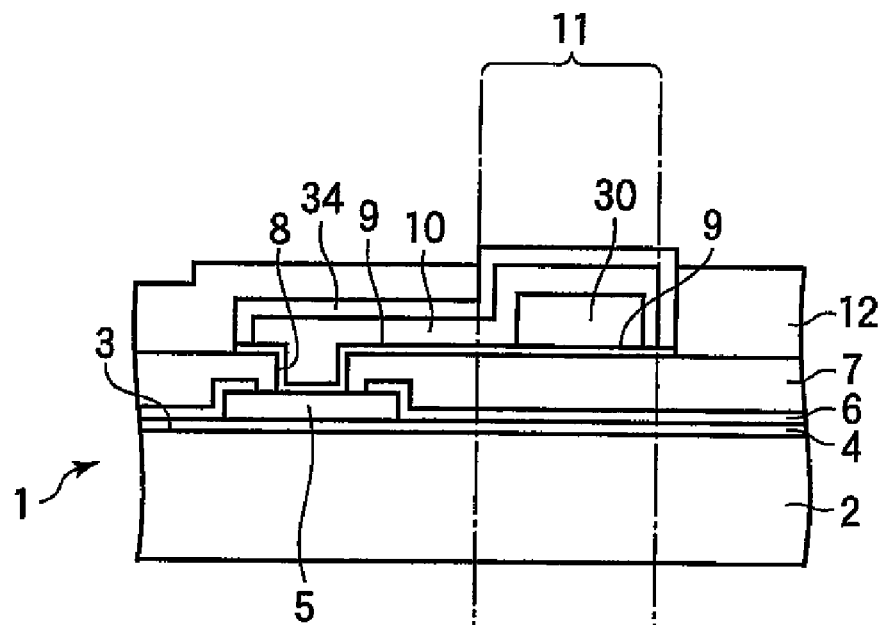
FIG. 68 (PG9)
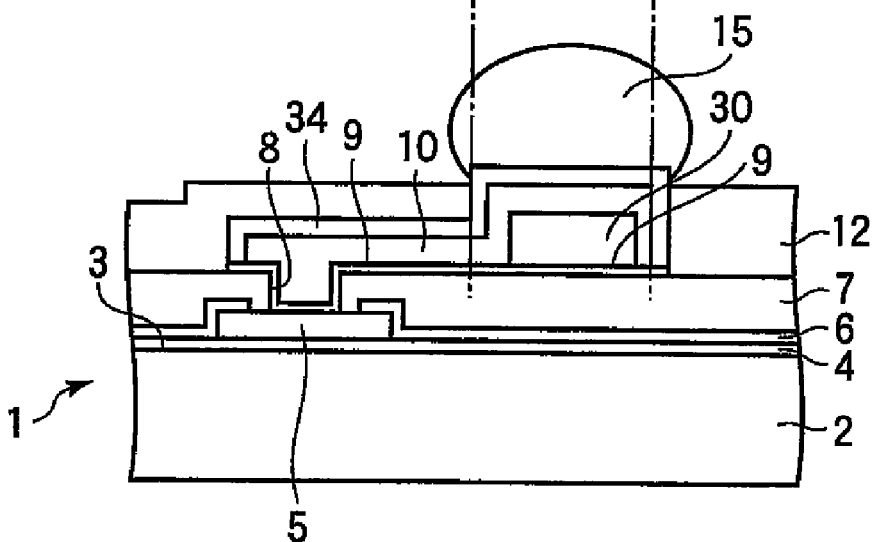
FIG. 69 (PG10)

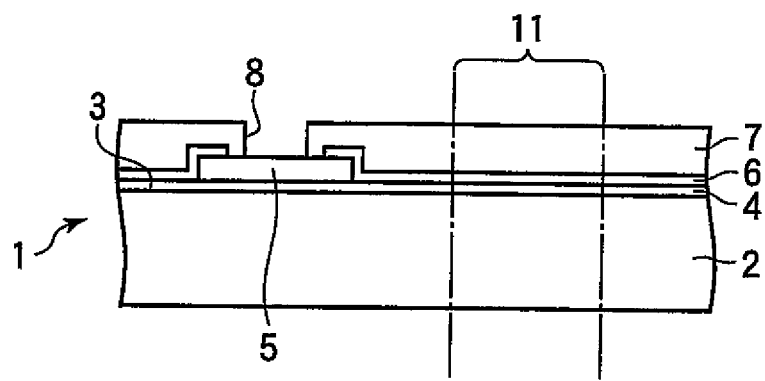
FIG.70 (PH1)
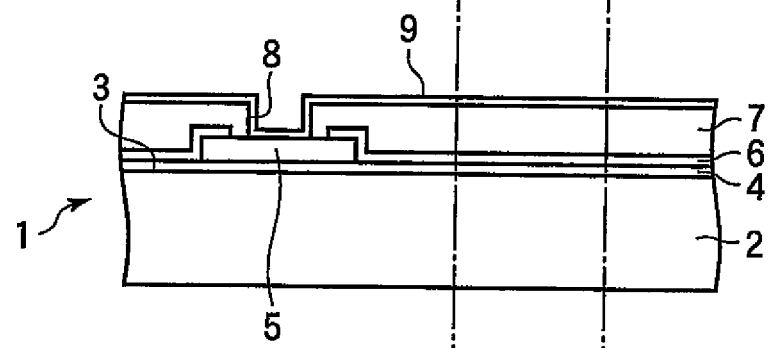
FIG.71 (PH2)
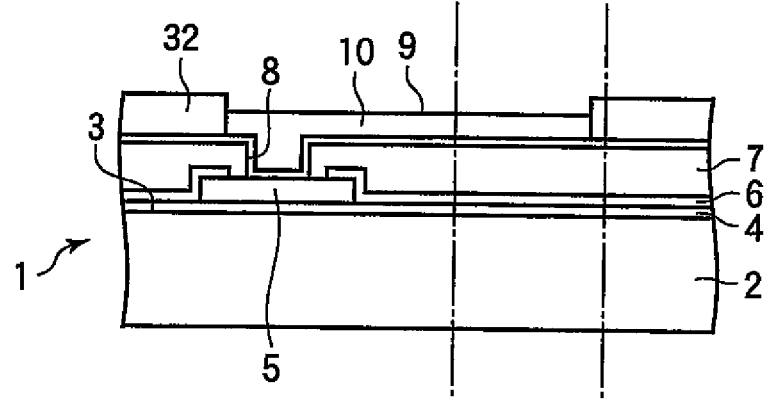
FIG.72 (PH3)
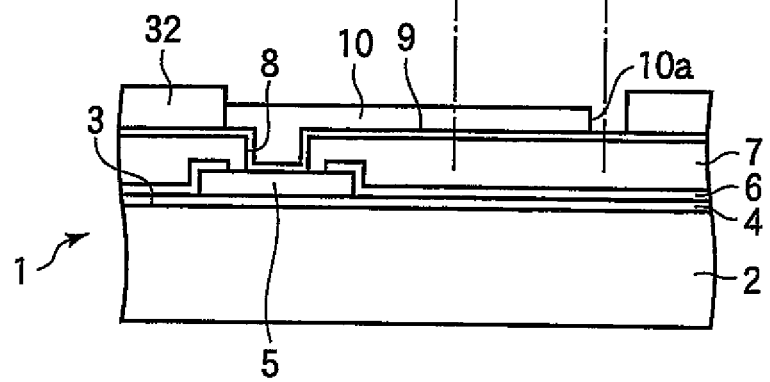
FIG.73 (PH4)

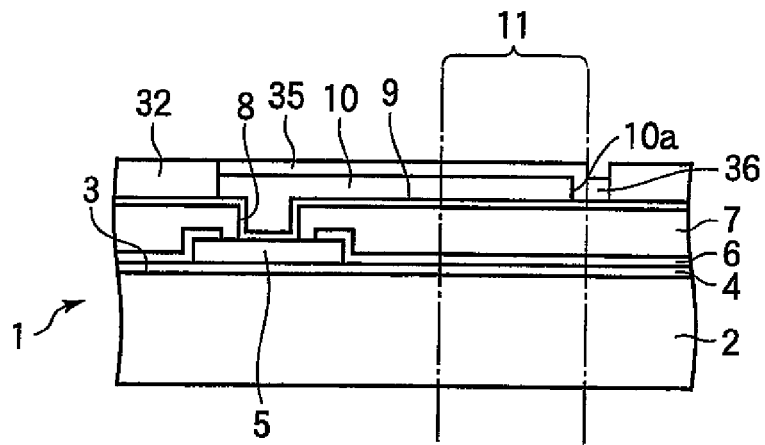
FIG. 74 (PH5)
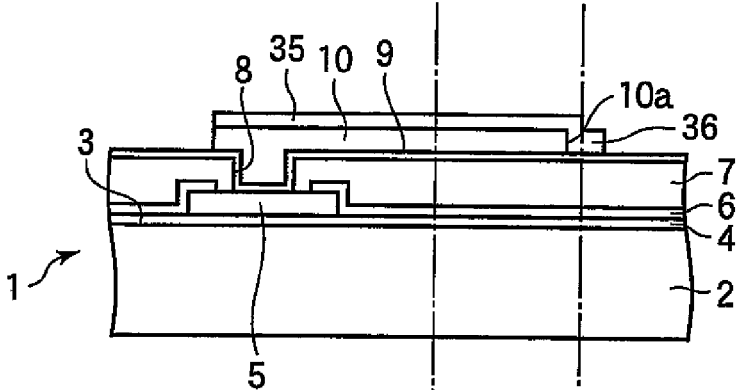
FIG. 75 (PH6)
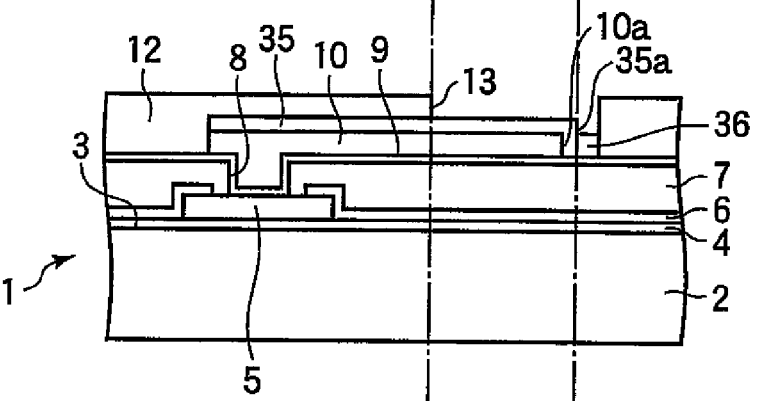
FIG. 76 (PH7)
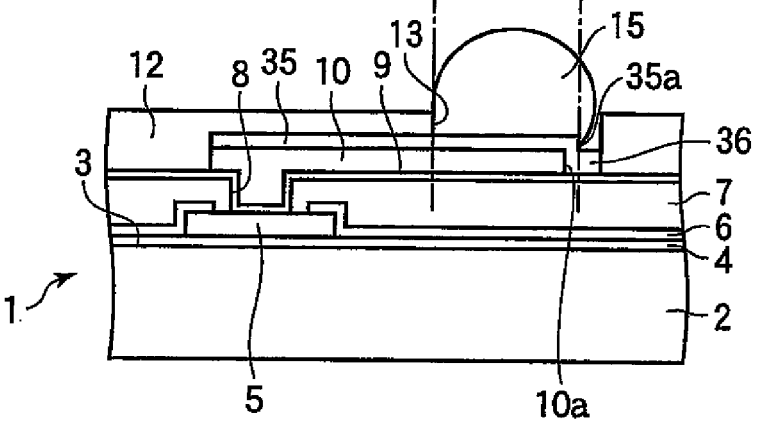
FIG. 77 (PH8)

SEMICONDUCTOR DEVICE FABRICATION METHOD

CROSS-REFERENCE TO RELATED APPLICATIONS

This application is a divisional application of application Ser. No. 11/294,502 filed on Dec. 6, 2005, which is hereby incorporated for all purposes.

BACKGROUND OF THE INVENTION

1. Field of the Invention

The present invention relates to a small semiconductor device such as a device with a wafer level chip size package, and to the fabrication of this type of semiconductor device, more particularly to the fabrication of electrodes on the surface of the package and their interconnections to pads on the semiconductor device within the package.

2. Description of the Related Art

With the recent rising demand for smaller, slimmer semiconductor integrated circuits, wafer level chip size packages have become prevalent, especially for thin semiconductor devices. A wafer level chip size package (WCSP) is simply a protective layer with a grid of hemispherical bump electrodes, formed on a semiconductor integrated circuit in the wafer processing stage before the wafer is diced into individual integrated circuit chips. WCSP semiconductor devices as thin as three-tenths of a millimeter (0.3 mm) have been developed.

In a conventional semiconductor device of the WCSP type, integrated circuits formed on the front major surface of the wafer are covered by a dielectric layer on which there are electrode pads electrically connected to the circuitry below. An interlayer dielectric film is then deposited, holes extending to the electrode pads are formed in this film, a layer of metal is deposited, filling the holes, and a conductive pattern of redistribution wiring is formed, extending from the holes to the grid sites where bump electrodes will be placed. Posts about one hundred micrometers (100 µm) high are created at these sites by coating the wafer with a layer of photoresist, forming holes in the photoresist layer, filling the holes with metal, and then removing the photoresist. The surface of the wafer is then sealed in a layer of resin injected in liquid form, after which the surface is polished to expose the posts, and hemispherical bumps are formed on the exposed ends of the posts. After this the wafer is diced into separate semiconductor devices. (See, for example, Japanese Patent Application Publication No. 2003-60120).

A problem with this process is that even after polishing, the resin layer is nearly as thick (e.g., 90 µm thick) as the original height of the posts, and takes up much of the total thickness (e.g., 30%) of the semiconductor device.

It is also known art to form bump electrodes without forming posts. (See, for example, Japanese Patent Application Publication No. H11-195665 and U.S. Pat. No. 6,621,164.)

SUMMARY OF THE INVENTION

An object of the present invention is to reduce the thickness of a semiconductor device having a wafer-level chip size package.

The invented semiconductor device includes a semiconductor substrate having a first surface, a second surface opposed to the first surface, and a circuit element formed on the first surface. An electrode pad disposed on the first surface is electrically coupled to the circuit element. A first metal layer is formed on the electrode pad, and a conductive pattern is formed on the first metal layer. The first-surface side of the semiconductor substrate is sealed by a protective layer having an opening exposing part of the conductive pattern. The opening is covered by an electrode that is electrically coupled to the part of the conductive pattern disposed within the opening.

This structure enables the thickness of the protective layer (the package layer in a wafer level chip size package) to be reduced because the electrode is connected directly to the conductive pattern. The protective layer may comprise a photosensitive material, which simplifies the formation of the opening for the electrode.

BRIEF DESCRIPTION OF THE DRAWINGS

In the attached drawings:

FIGS. 1, 2, 3, 4, 5, 6, and 7 illustrate steps in a semiconductor device fabrication process according to a first embodiment of the invention;

FIGS. 8, 9, 10, 11, 12, 13, 14, and 15 illustrate steps in a semiconductor device fabrication process according to a second embodiment;

FIGS. 16, 17, 18, 19, 20, 21, 22, 23, 24, and 25 illustrate steps in a semiconductor device fabrication process according to a third embodiment;

FIGS. 26, 27, 28, 29, 30, 31, and 32 illustrate steps in a semiconductor device fabrication process according to a fourth embodiment;

FIGS. 33, 34, 35, 36, 37, 38, 39, and 40 illustrate steps in a semiconductor device fabrication process according to a fifth embodiment;

FIGS. 41, 42, 43, 44, 45, 46, 47, and 48 illustrate steps in a semiconductor device fabrication process according to a sixth embodiment;

FIGS. 49, 50, 51, 52, 53, 54, 55, 56, 57, 58, and 59 illustrate steps in a semiconductor device fabrication process according to a seventh embodiment;

FIGS. 60, 61, 62, 63, 64, 65, 66, 67, 68, and 69 illustrate steps in a semiconductor device fabrication process according to an eighth embodiment; and FIGS. 70, 71, 72, 73, 74, 75, 76, and 77 illustrate steps in a semiconductor device fabrication process according to a ninth embodiment.

DETAILED DESCRIPTION OF THE INVENTION

Figure 1:
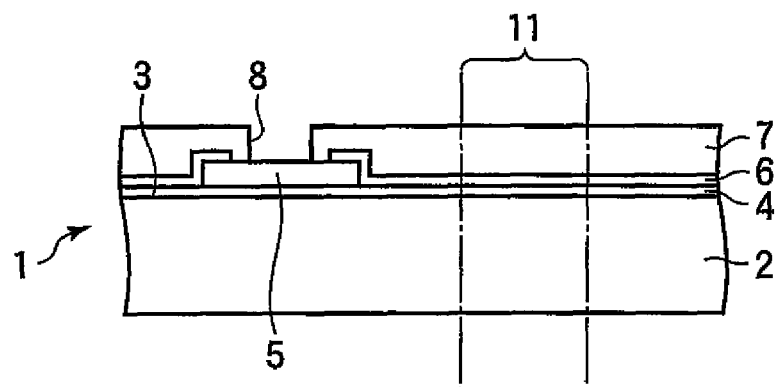

Embodiments of the invention will now be described with reference to the attached drawings, in which like elements are indicated by like reference characters. The drawings illustrate steps in the fabrication of semiconductor devices embodying the present invention. Each drawing is a cross-sectional view of the region of a semiconductor wafer around one electrode pad; the drawings illustrate the formation of a bump electrode and wiring connecting the bump electrode to the electrode pad. After the illustrated steps, the wafer will be diced into integrated circuit chips, each having a plurality of electrode pads and bump electrodes of the type illustrated.

First Embodiment

The first embodiment is a semiconductor device fabricated from a wafer 1 as illustrated in FIGS. 1 to 7.

The semiconductor wafer 1 includes a semiconductor substrate 2 having a front surface (the first surface, the upper surface in the drawings) and a back surface (the second surface, the lower surface in the drawings). The front surface is also referred to as the circuit surface 3, because it includes a plurality of interconnected circuit elements such as transistors (not shown). The circuit surface 3 is covered by a dielectric layer 4 of silicon dioxide with openings referred to as contact holes (not shown) leading to circuit elements on the circuit surface 3. The surface of the dielectric layer 4 is covered with a conductive metal film such as an aluminum film (not shown). The metal is patterned to form interconnection wiring (not shown) that is electrically coupled to the circuitry on the circuit surface 3 through the contact holes.

Patterning of the conductive metal film also produces a plurality of electrode pads 5, one of which is shown in the drawings. Each electrode pad 5 is electrically coupled to a corresponding circuit element on the circuit surface 3. The dielectric layer 4 is covered by a surface protection layer 6 of silicon nitride, which also covers the edges of the electrode pads 5. An interlayer dielectric film 7 of polyimide resin is formed on the surface protection layer 6, with through holes 8 extending to the electrode pads 5, to reduce stress applied to the semiconductor substrate 2.

A metal underlayer 9 is deposited as a multilayer film on the entire front surface of the semiconductor wafer 1 by sputtering, covering the interlayer dielectric film 7, the inner walls of the through holes 8, and the electrode pads 5. A conductive pattern of redistribution wiring, referred to below as a redistribution pattern 10, is formed by selectively electro-depositing copper on the surface of the metal underlayer 9, using a photoresist mask 17 (FIG. 3) that exposes only the parts of the metal underlayer 9 disposed above the electrode pads 5, the parts of the metal underlayer 9 disposed in electrode areas 11 in which bump electrodes 15 (FIG. 7) will be formed, and an interconnecting part that connects each electrode pad 5 to one electrode area 11. The metal underlayer 9 is removed after the electro-deposition process, except for the parts disposed beneath the redistribution pattern 10.

The front surface of the semiconductor substrate 2 is sealed by a protective layer 12 formed by curing a positive or negative photosensitive resin, such as an epoxy resin or polyimide resin, by selective exposure to ultraviolet light, which makes the resin soluble (if positive) or insoluble (if negative) in a chemical developing solution. In the first embodiment, the protective layer 12 is formed by curing a negative photosensitive resin using polybenzoxazole that, when exposed to ultraviolet light, becomes hardened and insoluble in the developing solution.

After development, the uncured parts of the protective layer 12 become electrode openings 13 that extend to and expose the redistribution pattern 10 in the electrode areas 11. The bump electrodes 15 are formed by melting solder balls printed on the electrode areas 11, so that the bump electrodes 15 cover the electrode areas 11 and make direct electrical contact with the redistribution pattern 10 at the bottom of each electrode opening 13.

A fabrication method for the semiconductor device in the first embodiment includes the steps P1 to P7 illustrated in FIGS. 1 to 7.

In step P1 in FIG. 1, a plurality of interconnected circuit elements (not shown) are formed on the circuit surface 3 of the semiconductor substrate 2, which is a generally circular wafer formed by slicing a cylindrical bar of silicon. The circuit surface 3 is covered by the dielectric layer 4 having contact holes (not shown) leading to the circuit elements on the circuit surface 3, an aluminum film is sputtered onto the surface of the dielectric layer 4, and the aluminum metal is patterned by photolithography and etching to produce a plurality of electrode pads 5. Each electrode pad 5 is electrically coupled to a corresponding circuit element on the circuit surface 3 through a corresponding contact hole.

After formation of the electrode pads 5, the surface protection layer 6 of silicon nitride is deposited on the surfaces of the electrode pads 5 and the dielectric layer 4 by chemical vapor deposition (CVD), part of the surface protection layer 6 on the surfaces of the electrode pads 5 is removed by etching, the interlayer dielectric film 7 of polyimide resin is formed on the surface protection layer 6 and the electrode pads 5, and part of the interlayer dielectric film 7 on the surfaces of the electrode pads 5 is removed by etching to form through holes 8 extending to the electrode pads 5.

Figure 2:
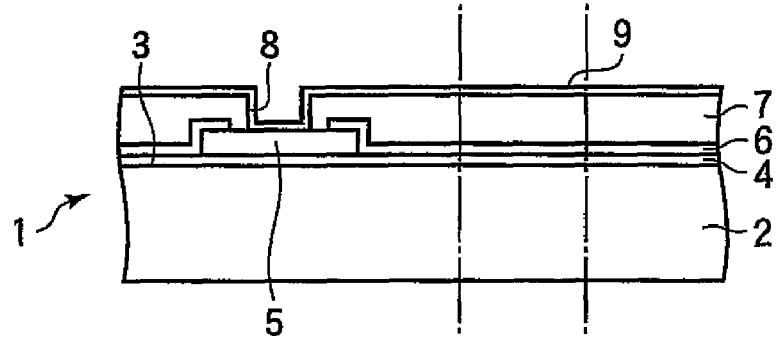

In step P2 in FIG. 2, the multilayer metal underlayer 9 is sputtered onto the entire front surface of the semiconductor wafer 1, covering the interlayer dielectric film 7 and the electrode pads 5.

Figure 3:
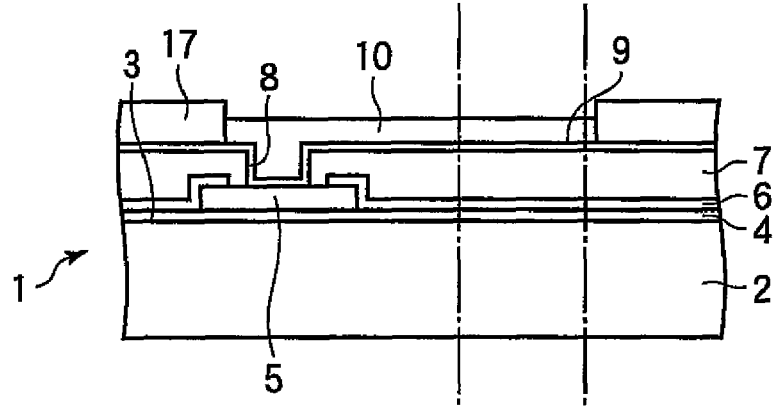

In step P3 in FIG. 3, the photoresist mask 17 is formed. The photoresist mask 17 covers all parts of the metal underlayer 9 except for the parts, extending from the surfaces of the electrode pads 5 to the electrode areas 11, in which the redistribution pattern 10 will be formed. The photoresist mask 17 comprises a positive or negative photoresist material that is spin-coated onto the wafer 1 and then patterned by photolithography. Photolithography in this case means exposing the photoresist material to light through a mask and then chemically developing the photoresist material. Copper is electrodeposited on the uncovered surface of the metal underlayer 9, using the metal underlayer 9 as a negative electrode, to form the redistribution pattern 10.

Figure 4:
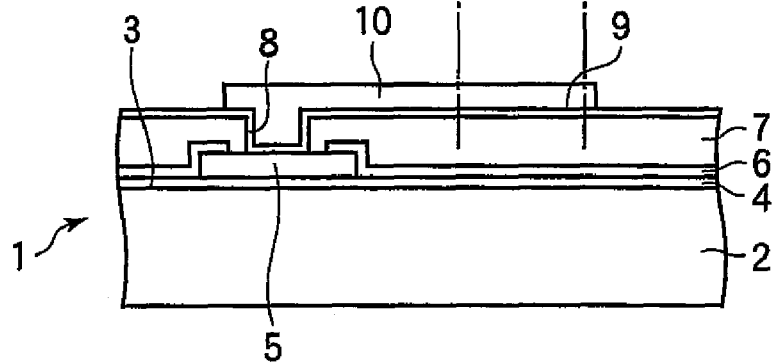
Figure 16:
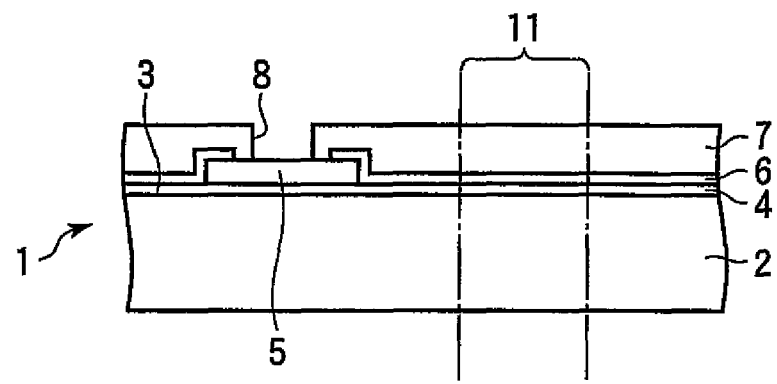
Figure 17:
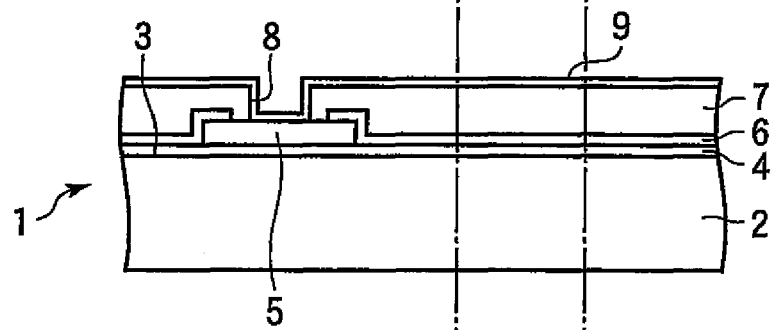
Figure 18:
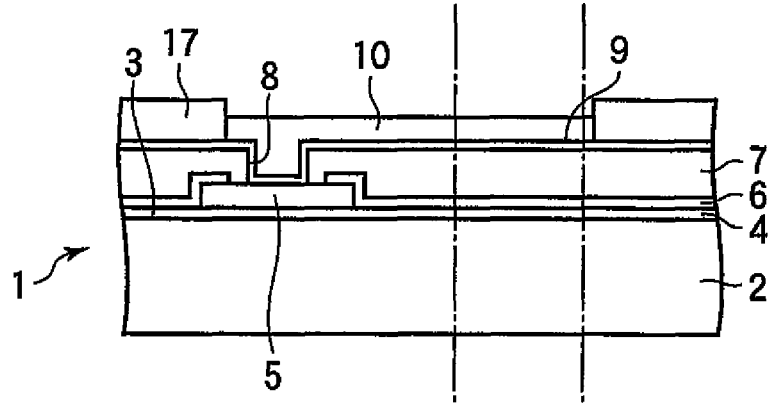
Figure 19:
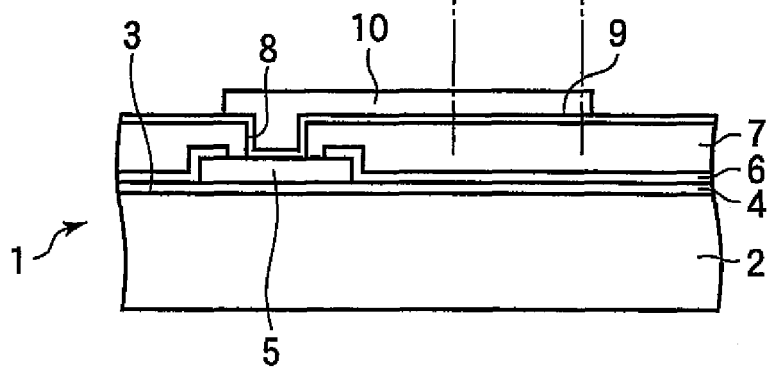
Figure 53:
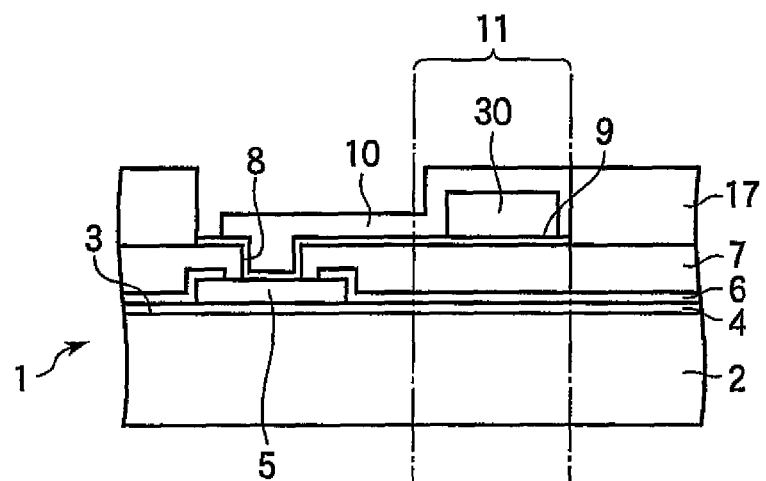

In step P4 in FIG. 4, the photoresist mask 17 that was formed in step P3 is removed with a solvent such as acetone.

In step P5 in FIG. 5, the metal underlayer 9, except for the part below the redistribution pattern 10, is removed by plasma etching in an oxygen atmosphere.

In step P6 in FIG. 6, a polybenzoxazole photosensitive resin is applied to the entire front surface of the semiconductor wafer 1 by a spin-coating process, and the applied photosensitive resin is exposed to ultraviolet light with a photoresist mask masking the electrode areas 11, curing the photosensitive resin except the part in the masked electrode areas 11. The unexposed photosensitive resin is removed by chemical development, leaving a protective layer 12 about five micrometers (5 μm) thick with electrode openings 13 measuring about two hundred micrometers (200 μm) in diameter extending to the redistribution pattern 10 in the electrode areas 11.

In step P7 in FIG. 7, flux is applied to the redistribution pattern 10 that is exposed at the bottom of each electrode opening 13 in the protective layer 12. A template (not shown) having approximately the same diameter as the semiconductor wafer 1 and having apertures slightly larger in diameter than the solder balls is mounted on the wafer. The solder balls are dropped into the apertures and thereby emplaced in the electrode openings 13 of the protective layer 12; then the template is removed and a heat treatment or reflow process is performed to melt the solder balls, thereby forming hemispherical bump electrodes 15 that project from the front surface of the protective layer 12 and are directly joined to the redistribution pattern 10 exposed at the bottom of the electrode openings 13.

After steps P1 to P7 above, the semiconductor wafer 1 is diced into individual integrated circuit chips, each including a plurality of semiconductor circuit elements. Each chip is a separate WCSP semiconductor device.

Since a WCSP semiconductor device fabricated as described above includes a plurality of bump electrodes 15 projecting from the front surface of the protective layer 12 of the semiconductor device and directly joined to the redistribution pattern 10, instead of being formed on posts, no thick resin layer is required to seal the posts. The method described in the first embodiment can be used to fabricate WCSP semiconductor devices with thicknesses as small as twenty-two hundredths of a millimeter (0.22 mm).

The use of a photosensitive material for the protective layer 12 that seals the front surface of the semiconductor device simplifies the formation of the electrode openings 13 for the bump electrodes 15.

Application of flux to the electrode openings 13 before the solder balls are placed in the electrode openings 13 and melted secures reliable solder joints between the redistribution pattern 10 and the bump electrodes 15 by blocking air currents.

Compared with conventional WCSP fabrication processes that form posts, the fabrication process described in the first embodiment has fewer steps: specifically, it does not require steps to form a photoresist layer defining the posts, to form the posts, and then to remove the photoresist layer; it is also unnecessary to polish the front surface of the resin protective layer to expose the ends of the posts before forming the bump electrodes. WCSP semiconductor devices according to the first embodiment can accordingly be fabricated more efficiently and in a shorter time than devices having posts.

As described above, in the first embodiment, the front surface of a semiconductor device is sealed by a protective layer having openings exposing part of a redistribution pattern of conductive traces. The openings are covered by bump electrodes that make direct contact with the redistribution pattern. This structure enables the thickness of the protective layer (the package layer in a wafer level chip size package) to be reduced. The protective layer may comprise a photosensitive material, which simplifies the formation of the openings for the electrodes.

Second Embodiment

The second embodiment is a semiconductor device fabricated from a wafer 1 as illustrated in FIGS. 8 to 15.

The second embodiment differs from the first embodiment by including conductive nubs referred to below as redistribution nubs 21, seen in FIGS. 12 to 15. The redistribution nubs 21 are cylindrical projections of the same material as the redistribution pattern 10, and are formed in the electrode areas 11, making direct electrical contact with the redistribution pattern 10.

A fabrication method for the semiconductor device in the second embodiment includes the steps PA1 to PA8 illustrated in FIGS. 8 to 15.

Since steps PA1 to PA4 in FIGS. 8 to 11 are the same as steps P1 to P4 in FIGS. 1 to 4 in the first embodiment, descriptions will be omitted.

In step PA5 in FIG. 12, a second photoresist mask 17 is formed (this photoresist mask is different from the photoresist mask used in step PA3 in FIG. 10). The second photoresist mask 17 covers all parts of the metal underlayer 9 and the redistribution pattern 10 except for the parts of the metal underlayer 9 below the redistribution pattern 10 and the parts of the redistribution pattern 10 in the electrode areas 11. The photoresist mask 17 is a positive or negative photoresist material that is patterned by photolithography. Copper is electrodeposited on the exposed parts of the redistribution pattern 10, using the metal underlayer 9 as a negative electrode, to form the redistribution nubs 21.

In step PA6 in FIG. 13, the photoresist mask 17 that was formed in step PA5 is removed with a solvent, and the metal underlayer 9, except for the part below the redistribution pattern 10, is removed as in step P5 in the first embodiment.

In step PA7 in FIG. 14, a photosensitive resin is applied to the entire front surface of the semiconductor wafer 1 by a spin-coating process, and the applied photosensitive resin is exposed to ultraviolet light, curing the photosensitive resin, except for the parts residing on the redistribution nubs 21, which are masked. The unexposed photosensitive resin on the redistribution nubs 21 is removed by chemical development, leaving a protective layer 12 about 5 µm thick with redistribution nubs 21 projecting from the protective layer 12.

After steps PA1 to PA8 above, the semiconductor wafer 1 is diced into individual integrated circuit chips, each including a plurality of semiconductor circuit elements. Each chip is a separate WCSP semiconductor device.

Since a WCSP semiconductor device fabricated as described above includes a plurality of bump electrodes 15 projecting from the front surface of the protective layer 12 of the semiconductor device and electrically coupled to the redistribution pattern 10 through the redistribution nubs 21, instead of being formed on posts, a thin resin layer suffices to seal the front surface of the semiconductor device. The method described in the second embodiment can therefore be used to fabricate WCSP semiconductor devices with reduced thicknesses.

The use of a photosensitive material for the protective layer 12 that seals the front surface of the semiconductor device simplifies the formation of the protective layer 12 around the projecting redistribution nubs 21. Compared with conventional WCSP fabrication processes that form posts, the fabrication process described in the second embodiment has fewer steps because it is unnecessary to polish the front surface of the resin protective layer to expose the ends of the posts before forming the bump electrodes. WCSP semiconductor devices according to the second embodiment can accordingly be fabricated more efficiently and in a shorter time than devices having posts.

The large area of both vertical and horizontal contact between the hemispherical bump electrodes 15 and the projecting redistribution nubs 21 assures reliable solder joints between the bump electrodes 15 and the redistribution nubs 21. After the semiconductor device is mounted on a printed circuit board or card, the redistribution nubs 21 absorb external stress applied to the bump electrodes 15, making the external electrical connections of the semiconductor device still more reliable.

As described above, in the second embodiment, the front surface of a semiconductor device is sealed by a protective layer with openings for projecting conductive nubs, which are formed on the redistribution pattern, and bump electrodes are formed on the nubs. The protective layer may comprise a photosensitive material, which simplifies removal of the protective material from the nubs. The projecting structure enables the thickness of the protective layer (the package layer in a wafer level chip size package) to be reduced, and allows secure joints to be formed between the bump electrodes and the nubs, so the semiconductor device is electrically coupled to external devices with high reliability.

Third Embodiment

The third embodiment is a semiconductor device fabricated from a wafer 1 as illustrated in FIGS. 16 to 25.

The third embodiment differs from the first embodiment by including a second metal underlayer 23 and conductive redistribution nubs 24. In FIG. 22, the second metal underlayer 23 is deposited as a multilayer film on the entire front surface of the protective layer 12 by sputtering, as was the metal underlayer 9 in the first embodiment and is patterned by etching to cover the edges of the electrode openings 13 in the protective layer 12, the exposed parts of redistribution pattern 10 at the bottom of the electrode openings 13, and the inner walls of the electrode openings 13.

The conductive redistribution nubs 24 are generally cylindrical projections of the same material as the redistribution pattern 10. The conductive redistribution nubs 24 have large-diameter and small-diameter parts, and are formed on the electrode areas 11, making direct electrical contact with the second metal underlayer 23.

A fabrication method for the semiconductor device in the third embodiment includes the steps PB1 to PB10 illustrated in FIGS. 16 to 25.

Since steps PB1 to PB6 in FIGS. 16 to 21 are the same as steps P1 to P6 in FIGS. 1 to 6 in the first embodiment, descriptions will be omitted. In step PB2, the first metal underlayer 9 is deposited on the entire front surface of the semiconductor substrate 2.

In step PB7 in FIG. 22, the multilayer second metal underlayer 23 is sputtered onto the entire front surface of the wafer, covering the protective layer 12, the exposed parts of the redistribution pattern 10 at the bottom of the electrode openings 13, and the inner walls of the electrode openings 13.

In step PB8 in FIG. 23, the photoresist mask 17 is formed. The photoresist mask 17 covers all parts of the second metal underlayer 23 except for the electrode openings 13 and the edges of the electrode openings 13. The photoresist mask 17 is a positive or negative photoresist material that is patterned by photolithography. Copper is electro-deposited on the exposed parts of the second metal underlayer 23, using the second metal underlayer 23 as a negative electrode, to form the conductive redistribution nubs 24. The large-diameter parts of the conductive redistribution nubs 24 project from the protective layer 12.

In step PB9 in FIG. 24, the photoresist mask 17 that was formed in step PB8 is removed with a solvent, and the second metal underlayer 23, except for the parts below the conductive redistribution nubs 24, is removed as in step P5 in the first embodiment.

In step PB10 in FIG. 25, flux is applied to the parts of the conductive redistribution nubs 24 that project from the front surface of the semiconductor wafer 1. Solder balls are emplaced at the ends of the conductive redistribution nubs 24 with a template as in step P7 in the first embodiment; then a heat treatment process is performed to melt the solder balls, thereby forming hemispherical bump electrodes 15 that cover the large-diameter parts of the conductive redistribution nubs 24 projecting from the protective layer 12.

After steps PB1 to PB10 above, the semiconductor wafer 1 is diced into individual integrated circuit chips, each including a plurality of semiconductor circuit elements. Each chip is a separate WCSP semiconductor device.

Since a WCSP semiconductor device fabricated as described above includes a plurality of bump electrodes 15 projecting from the front surface of the protective layer 12 of the semiconductor device and electrically coupled to the redistribution pattern 10 through the conductive redistribution nubs 24 and the second metal underlayer 23, instead of being formed on posts, a thin resin layer suffices to seal the front surface of the semiconductor device. The method described in the third embodiment can therefore be used to fabricate WCSP semiconductor devices with reduced thicknesses.

Use of a photosensitive protective layer 12 to seal the front surface of the semiconductor device simplifies the formation of the electrode openings 13 for the conductive redistribution nubs 24.

The conductive redistribution nubs 24 are joined to the exposed parts of the redistribution pattern 10 at the bottom of the electrode openings 13, to the inner walls of the electrode openings 13, and to the edges of the protective layer 12 surrounding the electrode openings 13 through the second metal underlayer 23. The hemispherical bump electrodes 15 cover the parts of the conductive redistribution nubs 24 that project from the protective layer 12. The joints between the bump electrodes 15 and the conductive redistribution nubs 24 are highly reliable, as in the second embodiment, and the joints between the conductive redistribution nubs 24 and the semiconductor wafer 1 are also highly reliable, so the reliability of the external electrical connections of the semiconductor device is further improved.

As described above, in the third embodiment, the front surface of a semiconductor device is sealed by a protective layer having openings exposing parts of a redistribution pattern. A metal underlayer covers the exposed parts of the redistribution pattern as well as the inner walls and upper edges of the openings. A metal nub, formed on this metal underlayer, projects from each opening in the protective layer. A bump electrode is placed on the nub. The protective layer may comprise a photosensitive material, which simplifies the formation of the openings for the nubs. This structure provides secure joints between the bump electrodes and the nubs, and secure joints between the nubs and the semiconductor device, so the external electrical connections of the semiconductor device are highly reliably.

Fourth Embodiment

The fourth embodiment is a semiconductor device fabricated from a wafer 1 as illustrated in FIGS. 26 to 32.

The fourth embodiment differs from the first embodiment by including interlayer dielectric nubs 26, with corresponding differences in the metal underlayer 9, redistribution pattern 10, and bump electrodes 15. As shown in FIG. 26, the interlayer dielectric nubs 26 are cylindrical projections of the interlayer dielectric film 7. The interlayer dielectric nubs 26 and the interlayer dielectric film 7 are formed by twice curing a negative photosensitive resin, such as a polyimide resin.

A fabrication method for the semiconductor device in the fourth embodiment includes the steps PC1 to PC7 illustrated in FIGS. 26 to 32.

In step PC1 in FIG. 26, a plurality of interconnected circuit elements are formed on the circuit surface 3 of the semiconductor substrate 2; the dielectric layer 4, the electrode pads 5, and the surface protection layer 6 are formed; and the surface protection layer 6 is partly removed from the surfaces of the electrode pads 5, as in step P1 in the first embodiment.

A comparatively thick coat of negative photosensitive polyimide resin is applied to the surfaces of the surface protection layer 6 and the electrode pads 5 by a spin-coating process, and the applied photosensitive resin coating is exposed to ultraviolet light through a mask that masks the through holes 8, curing the lower part of the photosensitive resin coating elsewhere to the thickness of the interlayer dielectric film 7. The photosensitive resin in the electrode areas 11, which will become the interlayer dielectric nubs 26, is exposed to ultraviolet light again through a mask that masks all parts except for the electrode areas 11, curing the resin in the electrode areas 11 to the additional thickness of the interlayer dielectric nubs 26 so that when the redistribution pattern 10 is formed later (FIG. 28), the parts of the redistribution pattern 10 formed on the surfaces of the interlayer dielectric nubs 26 will project from the front surface of the protective layer 12. The unexposed photosensitive resin is then removed by chemical development, leaving the through holes 8 extending to the electrode pads 5 and forming the interlayer dielectric film 7 and the interlayer dielectric nubs 26.

In step PC2 in FIG. 27, the metal underlayer 9 is sputtered onto the entire front surface of the semiconductor wafer 1, covering the interlayer dielectric nubs 26, the interlayer dielectric film 7, and the electrode pads 5 as in step P2 in the first embodiment.

In step PC3 in FIG. 28, a photoresist mask 17 is formed. The photoresist mask 17 covers all parts of the metal underlayer 9 except for the parts, extending from the surfaces of the electrode pads 5 to the interlayer dielectric nubs 26 in the electrode areas 11, in which the redistribution pattern 10 will be formed. The photoresist mask 17 comprises a positive or negative photoresist material that is patterned by photolithography. The redistribution pattern 10 is formed on the exposed surface of the metal underlayer 9 as in step P3 in the first embodiment.

In step PC4 in FIG. 29, the photoresist mask 17 that was formed in step PC3 is removed with a solvent.

In step PC5 in FIG. 30, the metal underlayer 9, except for the part below the redistribution pattern 10, is removed as in step P5 in the first embodiment.

In step PC6 in FIG. 31, a photosensitive resin is applied to the entire front surface of the semiconductor wafer 1 by a spin-coating process, and the applied photosensitive resin is exposed to ultraviolet light, curing the photosensitive resin, except for the parts residing in the electrode areas 11, which are masked. The unexposed photosensitive resin is removed by chemical development, leaving a protective layer 12 about 5 μm thick with parts of the redistribution pattern 10 projecting from the protective layer 12 in the electrode areas 11.

In step PC7 in FIG. 32, flux is applied to the parts of the redistribution pattern 10 that project from the front surface of the semiconductor wafer 1. Solder balls are emplaced at the ends of the parts of the redistribution pattern 10 in the electrode areas 11 with a template as in step P7 in the first embodiment; then a heat treatment process is performed to melt the solder balls, thereby forming hemispherical bump electrodes 15 that cover the parts of the redistribution pattern 10 projecting from the protective layer 12.

After steps PC1 to PC7 above, the semiconductor wafer 1 is diced into individual integrated circuit chips, each including a plurality of semiconductor circuit elements. Each chip is a separate WCSP semiconductor device.

Since a WCSP semiconductor device fabricated as described above includes a plurality of bump electrodes 15 that project from the front surface of the protective layer 12 of the semiconductor device and are formed on parts of the redistribution pattern 10 that also project from the protective layer 12, instead of being formed on posts, a thin resin layer suffices to seal the front surface of the semiconductor device. The method described in the fourth embodiment can therefore be used to fabricate WCSP semiconductor devices with reduced thicknesses.

Use of a photosensitive protective layer 12 to seal the front surface of the semiconductor device simplifies the formation of the protective layer 12 around the projecting parts of the redistribution pattern 10.

In step PC1, a comparatively heavy coat of negative photosensitive resin is applied to the surfaces of the surface protection layer 6 and the electrode pads 5. The applied photosensitive resin is exposed to ultraviolet light through a mask masking the through holes 8; then the photosensitive resin is exposed to ultraviolet light again through another mask masking the parts of the interlayer dielectric film 7 in the electrode areas 11, thereby forming the interlayer dielectric film 7 and the interlayer dielectric nubs 26 in one step. This compares favorably with conventional WCSP fabrication processes that use three steps to form posts (a step of forming a photoresist layer defining the posts, a step of forming the posts, and a further step of removing the photoresist layer) and must then polish the front surface of the resin protective layer to expose the ends of the posts before forming the bump electrodes. WCSP semiconductor devices according to the fourth embodiment can accordingly be fabricated more efficiently and in a shorter time than devices having posts.

The hemispherical bump electrodes 15 cover the parts of the redistribution pattern 10 that are formed on the interlayer dielectric nubs 26 and project from the protective layer 12, thereby securing reliable solder joints between the bump electrodes 15 and the redistribution pattern 10. After the semiconductor device is mounted on a printed circuit board or card, the redistribution pattern 10 and interlayer dielectric nubs 26 absorb external stress applied to the bump electrodes 15, making the external electrical connections of the semiconductor device more reliable.

As described above, in the fourth embodiment, the front surface of a semiconductor device is sealed by a protective layer. Parts of a redistribution pattern that are formed on nubs project from the protective layer, and bump electrodes are placed on those parts of the redistribution pattern. The protective layer may comprise a photosensitive material, which simplifies removal of the protective material from the projecting parts of the redistribution pattern. The projecting structure enables the thickness of the protective layer (the package layer in a wafer level chip size package) to be reduced, and the solder joints between the bump electrodes and the redistribution pattern to be made more secure, so the semiconductor device is electrically coupled to external devices with greater reliability.

Fifth Embodiment

The fifth embodiment is a semiconductor device fabricated from a wafer 1 as illustrated in FIGS. 33 to 40. The fifth embodiment differs from the first embodiment by including interlayer conductive nubs 30, and has a different redistribution pattern 10 and bump electrodes 15. The interlayer conductive nubs 30, seen in FIGS. 35 to 40, are cylindrical projections made of the same material as the redistribution pattern 10. The interlayer conductive nubs 30 are formed in the electrode areas 11, making direct electrical contact with the metal underlayer 9, to lift the redistribution pattern 10 above the protective layer 12.

A fabrication method for the semiconductor device in the fifth embodiment includes the steps PD1 to PD8 illustrated in FIGS. 33 to 40.

Since steps PD1 and PD2 in FIGS. 33 and 34 are the same as steps P1 and P2 in FIGS. 1 and 2 in the first embodiment, descriptions will be omitted.

In step PD3 in FIG. 35, a first photoresist mask 17 is formed. This photoresist mask 17 covers all parts of the metal underlayer 9 except for the electrode areas 11, in which the interlayer conductive nubs 30 will be formed. The photoresist mask 17 comprises a positive or negative photoresist material that is patterned by photolithography. To form the interlayer conductive nubs 30, the same type of metal as used for the redistribution pattern 10, which will be formed on the interlayer conductive nubs 30 in step PD5, is electro-deposited on the exposed parts of the metal underlayer 9, using the metal underlayer 9 as a negative electrode, to a thickness such that the redistribution pattern 10 will project from the front surface of the protective layer 12.

In step PD4 in FIG. 36, the photoresist mask 17 that was formed in step PD3 is removed with a solvent.

In step PD5 in FIG. 37, a second photoresist mask 17 is formed. This photoresist mask 17 covers all parts of the metal underlayer 9 except for the parts, extending from the surfaces of the electrode pads 5 to the interlayer conductive nubs 30 in the electrode areas 11, in which the redistribution pattern 10 will be formed. The photoresist mask 17 comprises a positive or negative photoresist material that is patterned by photolithography. The redistribution pattern 10 is formed on the exposed surface of the metal underlayer 9 as in step P3 in the first embodiment.

In step PD6 in FIG. 38, the photoresist mask 17 that was formed in step PD5 is removed with a solvent, and the metal underlayer 9, except for the part below the redistribution pattern 10 and the interlayer conductive nubs 30, is removed as in step P5 in the first embodiment.

In step PD7 in FIG. 39, a protective layer 12 about 5 ☐m thick is formed as in step PC6 in the fourth embodiment. The parts of the redistribution pattern 10 disposed on the interlayer conductive nubs 30 project from the protective layer 12 in the electrode areas 11.

In step PD8 in FIG. 40, hemispherical bump electrodes 15 are formed as in step PC7 in the fourth embodiment. The bump electrodes 15 cover the parts of the redistribution pattern 10 projecting from the front surface of the protective layer 12 of the semiconductor wafer 1.

After steps PD1 to PD8 above, the semiconductor wafer 1 is diced into individual integrated circuit chips, each including a plurality of semiconductor circuit elements. Each chip is a separate WCSP semiconductor device.

Since a WCSP semiconductor device fabricated as described above includes a plurality of bump electrodes 15 projecting from the front surface of the protective layer 12 of the semiconductor device and covering the parts of the redistribution pattern 10 projecting from the protective layer 12, instead of being formed on posts, a thin resin layer suffices to seal the front surface of the semiconductor device. The method described in the fifth embodiment can therefore be used to fabricate WCSP semiconductor devices with reduced thicknesses.

Use of a photosensitive protective layer 12 to seal the front surface of the semiconductor device simplifies the formation of the protective layer 12 around the projecting parts of the redistribution pattern 10. Compared with conventional WCSP fabrication processes that form posts, the fabrication process described in the fifth embodiment has fewer steps because it is unnecessary to polish the front surface of the resin protective layer to expose the ends of the posts before forming the bump electrodes. WCSP semiconductor devices according to the fifth embodiment can accordingly be fabricated more efficiently and in a shorter time than devices having posts.

The hemispherical bump electrodes 15 cover the parts of the redistribution pattern 10 that are formed on the interlayer conductive nubs 30 and project from the protective layer 12, thereby securing reliable solder joints between the bump electrodes 15 and the redistribution pattern 10. After the semiconductor device is mounted on a printed circuit board or card, the redistribution pattern 10 and the interlayer conductive nubs 30 absorb external stress applied to the bump electrodes 15, making the external electrical connections of the semiconductor device more reliable.

As described above, in the fifth embodiment, the front surface of a semiconductor device is sealed by a protective layer. Parts of the redistribution pattern project from the protective layer, because they are formed on nubs on an underlying metal layer, and bump electrodes are placed on the projecting parts. The protective layer may comprise a photosensitive material, which simplifies removal of the protective material from the projecting parts of the redistribution pattern. The projecting structure enables the thickness of the protective layer (the package layer in a wafer level chip size package) to be reduced, and the joints between the bump electrodes and the redistribution pattern to be made more secure, so the semiconductor device is electrically coupled to external devices with high reliability.

Sixth Embodiment

The sixth embodiment is a semiconductor device identical to the semiconductor device in the fifth embodiment but fabricated by the process illustrated in FIGS. 41 to 48. The photoresist masks 32 seen in FIGS. 43, 44, and 45, which replace the photoresist masks 17 of the fifth embodiment, comprise a positive photoresist material. The fabrication process will be described below.

Step PE1, illustrated in FIG. 41, and step PE2, illustrated in FIG. 42, are the same as steps P1 and P2 in FIGS. 1 and 2 in the first embodiment. Descriptions will be omitted.

In step PE3 in FIG. 43, a coat of positive photosensitive resin is spin-coated onto the surface of the metal underlayer 9 and dried. The dried photosensitive resin is exposed to ultraviolet light through a mask that masks all parts except for the electrode areas 11. The exposed photosensitive resin is then removed by chemical development, exposing the parts of the metal underlayer 9 on which interlayer conductive nubs 30 will be formed, and forming a first photoresist mask 32. The first photoresist mask 32 covers all parts of the metal underlayer 9 outside the electrode areas 11, and covers the parts in the electrode areas 11 in which interlayer conductive nubs 30 will not be formed. The interlayer conductive nubs 30 are formed on the exposed parts of the metal underlayer 9 as in step PD3 in the fifth embodiment.

In step PE4 in FIG. 44, the first photoresist mask 32, which was used to form the interlayer conductive nubs 30 in step PE3, is exposed to ultraviolet light again through a mask that masks all parts of the wafer 1 except for the surfaces of the electrode pads 5, the electrode areas 11, and paths leading from the electrode pads 5 to the electrode areas 11. The exposed portion of the first photoresist mask 32 is then removed by chemical development, forming a second photoresist mask 32 that exposes the metal underlayer 9 and the interlayer conductive nubs 30 in these areas, in which the redistribution pattern 10 will be formed.

In step PE5 in FIG. 45, the redistribution pattern 10 is formed on the exposed surface of the metal underlayer 9 and on the interlayer conductive nubs 30 as in step PD5 in the fifth embodiment.

Steps PE6 to PE8, illustrated in FIGS. 46 to 48, which form the protective layer 12 and bump electrodes 15, are the same as steps PD6 to PD8 in the fifth embodiment, illustrated in FIGS. 38 to 40, so descriptions will be omitted.

After steps PE1 to PE8 above, the semiconductor wafer 1 is diced into individual integrated circuit chips, each including a plurality of semiconductor circuit elements. Each chip is a separate WCSP semiconductor device.

As described above, in the sixth embodiment, the positive photoresist mask that is used to form the nubs is not removed, but is patterned by exposure to light again in the step that forms the first redistribution pattern. Compared with the fifth embodiment, one photoresist coating step is saved. In addition to the effects obtained in the fifth embodiment, WCSP semiconductor devices according to the sixth embodiment can be fabricated more efficiently and the indirect material cost can be reduced.

Seventh Embodiment

The seventh embodiment is a semiconductor device fabricated from a wafer 1 as illustrated in FIGS. 49 to 59. The seventh embodiment differs from the fifth and sixth embodiments by including a barrier metal layer 34 of a metal such as nickel, palladium, or gold. As seen in FIGS. 56 to 59, the barrier metal layer 34 covers all parts of the redistribution pattern 10 except for surfaces of contact between the redistribution pattern 10 and the metal underlayer 9, and between the redistribution pattern 10 and the interlayer conductive nubs 30, to prevent current from leaking from one segment of the redistribution pattern 10 to another due to moisture taken up by the protective layer 12 and the interlayer dielectric film 7.

A fabrication method for the semiconductor device in the seventh embodiment includes the steps PF1 to PF11 illustrated in FIGS. 49 to 59.

Steps PF1 to PF5, illustrated in FIGS. 49 to 53, are identical to steps PD1 to PD5 (FIGS. 33 to 37) in the fifth embodiment, so descriptions will be omitted.

Figure 54:
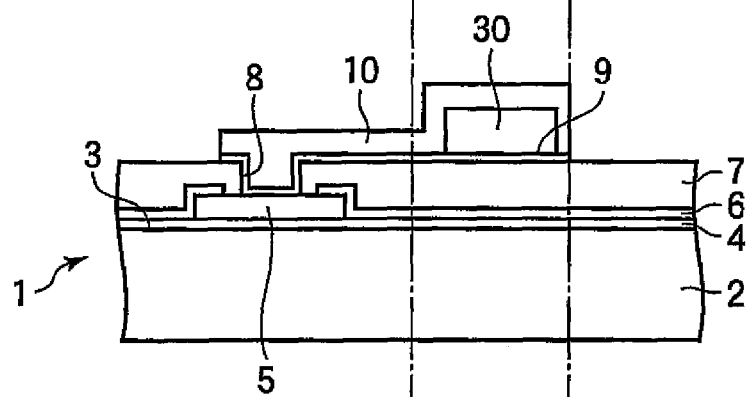

In step PF6 in FIG. 54, the second photoresist mask 17 that was formed in step PF5 is removed with a solvent.

Figure 55:
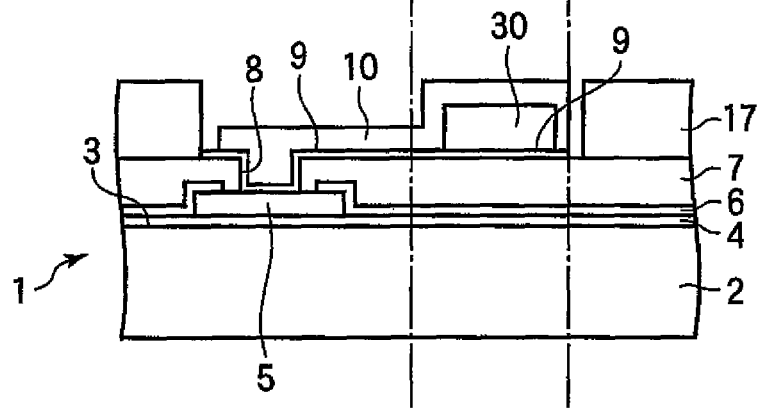

In step PF7 in FIG. 55, a third photoresist mask 17 is formed. This photoresist mask 17 covers all parts of the metal underlayer 9 except for the part below the redistribution pattern 10 and the interlayer conductive nubs 30 and the parts surrounding the redistribution pattern 10, in which the barrier metal layer 34 will be formed. The photoresist mask 17 comprises a positive or negative photoresist material that is patterned by photolithography.

Figure 56:
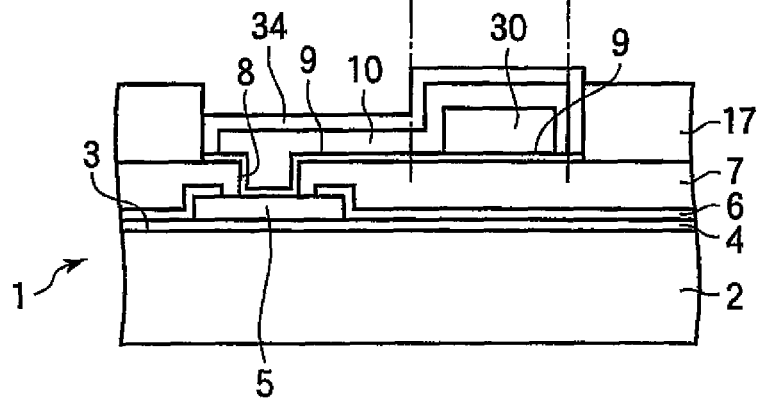
Figure 64:
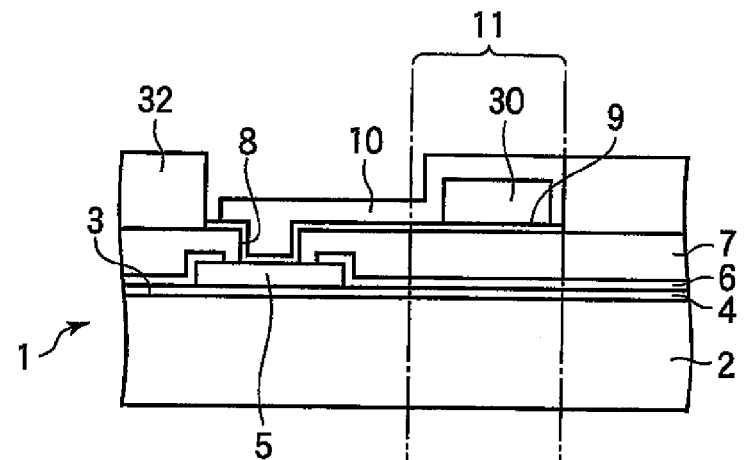

In step PF8 in FIG. 56, to form the barrier metal layer 34, a barrier metal is electro-deposited on the exposed parts of the metal underlayer 9 and the redistribution pattern 10, using the metal underlayer 9 as a negative electrode. The barrier metal layer 34 covers all parts of the redistribution pattern 10 except for the surfaces of contact between the redistribution pattern 10 and the metal underlayer 9, and between the redistribution pattern 10 and the interlayer conductive nubs 30.

In step PF9 in FIG. 57, the photoresist mask 17 that was formed in step PF7 is removed with a solvent, and the metal underlayer 9, except for the part below the redistribution pattern 10, the interlayer conductive nubs 30, and the barrier metal layer 34, is removed as in step P5 in the first embodiment.

In step PF10 in FIG. 58, a protective layer 12 about 5 μm thick is formed as in step PC6 in the fourth embodiment. The parts of the redistribution pattern 10 and barrier metal layer 34 that are disposed on the interlayer conductive nubs 30 project from the protective layer 12 in the electrode areas 11.

In step PF11 in FIG. 59, hemispherical bump electrodes 15 are formed as in step PC7 in the fourth embodiment. The bump electrodes 15 cover the parts of the redistribution pattern 10 that are covered by the barrier metal layer 34 and project from the front surface of the protective layer 12 of the semiconductor wafer 1.

After steps PF1 to PF11 above, the semiconductor wafer 1 is diced into individual integrated circuit chips, each including a plurality of semiconductor circuit elements. Each chip is a separate WCSP semiconductor device.

Since a WCSP semiconductor device fabricated as described above includes a plurality of bump electrodes 15 projecting from the front surface of the protective layer 12 of the semiconductor device, covering projecting parts of the redistribution pattern 10 and barrier metal layer 34 instead of being formed on posts, a thin resin layer suffices to seal the front surface of the semiconductor device. The method described in the seventh embodiment can therefore be used to fabricate WCSP semiconductor devices with reduced thicknesses.

Use of a photosensitive protective layer 12 to seal the front surface of the semiconductor device simplifies the formation of the protective layer 12 around the projecting parts of the redistribution pattern 10 and barrier metal layer 34.

The parts of the redistribution pattern 10 and barrier metal layer 34 that are covered by the hemispherical bump electrodes 15 are lifted above the protective layer 12 by the interlayer conductive nubs 30, which enhances the reliability of the solder joints between the bump electrodes 15 and the barrier metal layer 34. After the semiconductor device is mounted on a printed circuit board or card, the redistribution pattern 10 and the interlayer conductive nubs 30 absorb external stress applied to the bump electrodes 15, making the external electrical connections of the semiconductor device more reliable.

The barrier metal layer 34 covers all parts of the redistribution pattern 10 except for the surfaces of contact between the redistribution pattern 10 and the metal underlayer 9, and between the redistribution pattern 10 and the interlayer conductive nubs 30, so moisture taken up in the protective layer 12 and the interlayer dielectric film 7 cannot react with the copper material in the redistribution pattern 10, and does not cause current to leak from one segment of the redistribution pattern 10 to another. The semiconductor device accordingly has high moisture resistance and enhanced reliability.

As described above, in the seventh embodiment, a barrier metal layer covers all parts of the redistribution pattern except for the surfaces of contact between the redistribution pattern and the underlying metal layer, and between the redistribution pattern and the underlying nubs. In addition to the effects obtained in the fifth embodiment, the structure of the seventh embodiment prevents moisture taken up in the protective layer and the interlayer dielectric film from reacting with the redistribution pattern material, and therefore prevents current from leaking between different parts of the redistribution pattern due to moisture, so the semiconductor device has high moisture resistance and enhanced reliability.

Eighth Embodiment

The eighth embodiment is a semiconductor device identical to the semiconductor device in the seventh embodiment, but fabricated by the process illustrated in FIGS. 60 to 69, comprising steps PG1 to PG10. The fabrication process will be described below.

Since steps PG1 to PG5, illustrated in FIGS. 60 to 64, are the same as steps PE1 to PE6 in the sixth embodiment, illustrated in FIGS. 41 to 45. Descriptions will be omitted.

Figure 65:
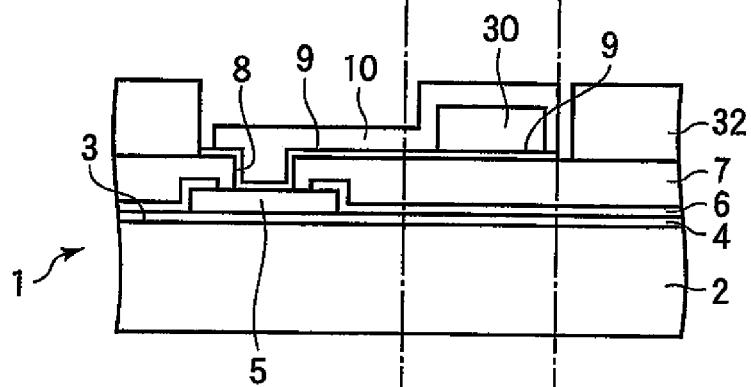
Figure 66:
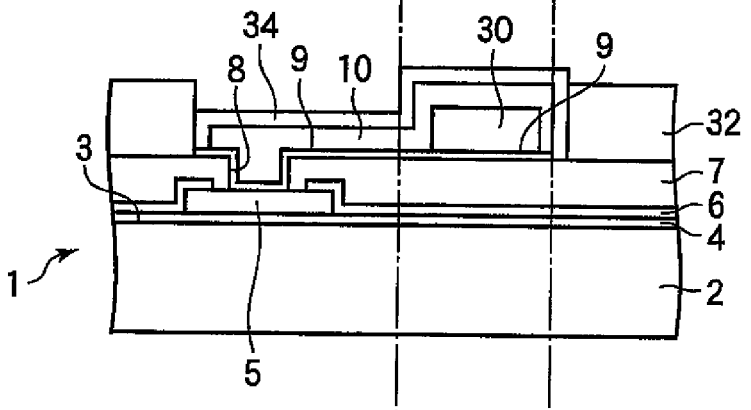
Figure 67:
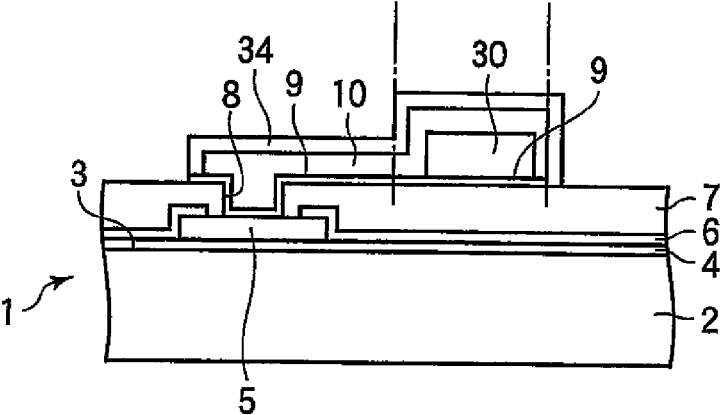

In step PG6 in FIG. 65, a third photoresist mask 32 is formed. After the first photoresist mask 32, which defined the interlayer conductive nubs 30 in step PG3 (FIG. 62), is exposed to ultraviolet light in step PG4 (FIG. 63), forming a second photoresist mask 32, and the redistribution pattern 10 is formed by use of the second photoresist mask 32 in step PG5 (FIG. 64), in step PG6 (FIG. 65), the second photoresist mask 32 is exposed to ultraviolet light through a mask that masks all parts of the wafer 1 except for the redistribution pattern 10 and a narrow area surrounding the redistribution pattern 10, these being the parts in which the barrier metal layer 34 will be formed. The exposed photoresist mask 32 is then removed by chemical development, uncovering the parts of the metal underlayer 9 on which the barrier metal layer 34 will be formed, to form the third photoresist mask 32, which covers the other parts of the metal underlayer 9.

Steps PG7 to PG10, illustrated in FIGS. 66 to 69, which form the protective layer 12 and bump electrodes 15, are the same as steps PF8 to PF11 (FIGS. 56 to 59) in the seventh embodiment. Descriptions will be omitted.

After steps PG1 to PG10 above, the semiconductor wafer 1 is diced into individual integrated circuit chips, each including a plurality of semiconductor circuit elements. Each chip is a separate WCSP semiconductor device.

As described above, in the eighth embodiment, the positive photoresist mask used to form nubs is left in place after the nubs have been formed and is patterned by two more exposures to light, one defining the first redistribution pattern, the other defining a barrier metal layer, so it is only necessary to deposit the photoresist material once. In addition to the effects seen in the seventh embodiment, WCSP semiconductor devices according to the eighth embodiment can be fabricated more efficiently and the indirect material cost can be reduced.

Ninth Embodiment

The ninth embodiment is a semiconductor device fabricated from a wafer 1 as illustrated in FIGS. 70 to 77. The ninth embodiment differs from the first embodiment by adding a second redistribution pattern 35 to redistribution pattern 10, which will be referred to below as the first redistribution pattern. The first redistribution pattern 10 also differs from the redistribution pattern 10 in the first embodiment in having an edge 10a disposed within the electrode area 11, as seen in FIGS. 73 to 77. As seen in FIGS. 74 to 77, the second redistribution pattern 35 covers the surface of the first redistribution pattern 10 and its edge 10a in the electrode areas 11, has an edge 35a disposed at the edge of the electrode area 11, and has an extension 36 extending from that edge 35a onto the surface of the metal underlayer 9.

A fabrication method for the semiconductor device in the ninth embodiment includes the steps PH1 to PH8 illustrated in FIGS. 70 to 77.

Steps PH1, illustrated in FIG. 70, and PH2, illustrated in FIG. 71, are the same as steps P1 and P2 in FIGS. 1 and 2 in the first embodiment. Descriptions will be omitted.

In step PH3 in FIG. 72, a coat of positive photosensitive resin is applied to the surface of the metal underlayer 9 by a spin-coating process, and the applied photosensitive resin is dried. The dried photosensitive resin is exposed to ultraviolet light through a mask that masks all parts except for the parts, extending from the surfaces of the electrode pads 5 to the electrode areas 11, in which the first redistribution pattern 10 will be formed. The exposed photosensitive resin is then removed by chemical development, exposing the parts of the metal underlayer 9 on which the first redistribution pattern 10 will be formed, and forming a first photoresist mask 32. The first photoresist mask 32 covers the other parts of the metal underlayer 9. The first redistribution pattern 10 is formed on the exposed parts of the metal underlayer 9 as in step P3 in the first embodiment.

In step PH4 in FIG. 73, after the first redistribution pattern 10 has been formed, the photoresist mask 32 is modified to form a second photoresist mask 32. Specifically, the first photoresist mask 32 is exposed to ultraviolet light through a mask that masks all parts of the wafer 1 except for the part in which the extensions 36 will be formed, this part extending from the edge 10a of the first redistribution pattern 10 in each electrode area 11 to a point outside the electrode area 11. The exposed photoresist mask 32 is then removed by chemical development, uncovering the part of the metal underlayer 9 on which the extensions 36 will be formed, and leaving the second photoresist mask 32, which covers the other parts of the metal underlayer 9.

In step PH5 in FIG. 74, the second redistribution pattern 35 is formed on the first redistribution pattern 10 and the exposed part of the metal underlayer 9 by electro-deposition, as in step P3 in the first embodiment. The part of the second redistribution pattern 35 formed on the metal underlayer 9 becomes the extensions 36.

In step PH6 in FIG. 75, the remaining part of the photoresist mask 32 that was formed in step PH3 is removed with a solvent, and the metal underlayer 9, except for the part below the first redistribution pattern 10 and the extensions 36, is removed as in step P5 in the first embodiment.

In step PH7 in FIG. 76, a photosensitive resin is applied to the entire front surface of the semiconductor wafer 1 as in step P6 in the first embodiment, and the applied photosensitive resin is exposed to ultraviolet light with a photoresist mask masking the electrode areas 11. The unexposed photosensitive resin is removed by chemical development, leaving a protective layer 12 about 5 μm thick with electrode openings 13 extending to the second redistribution pattern 35 in the electrode areas 11, and also exposing the extensions 36.

In step PH8 in FIG. 77, flux is applied to the second redistribution pattern 35, including the edge 35a and extensions 36, that is exposed at the bottom of each electrode opening 13 in the protective layer 12. Solder balls are emplaced in the electrode openings 13 with a template as in step P7 in the first embodiment; then a heat treatment process is performed to melt the solder balls, thereby forming hemispherical bump electrodes 15 that project from the front surface of the protective layer 12 and are directly joined to the second redistribution pattern 35 and the edges 35a thereof that are exposed at the bottom of the electrode openings 13.

After steps PH1 to PH8 above, the semiconductor wafer 1 is diced into individual integrated circuit chips, each including a plurality of semiconductor circuit elements. Each chip is a separate WCSP semiconductor device.

Since a WCSP semiconductor device fabricated as described above includes a plurality of bump electrodes 15 projecting from the front surface of the protective layer 12 of the semiconductor device and directly joined to the second redistribution pattern 35, instead of being formed on posts, a thin resin layer suffices to seal the front surface of the semiconductor device. The method described in the ninth embodiment can therefore be used to fabricate WCSP semiconductor devices with reduced thicknesses.

The use of a photosensitive material for the protective layer 12 that seals the front surface of the semiconductor device simplifies the formation of the electrode openings 13 for the bump electrodes 15.

The hemispherical bump electrodes 15 cover the second redistribution pattern 35, its edges 35a, and the extensions 36 that are exposed in the electrode openings 13 in the protective layer 12. The extensions 36 improve the reliability of the solder joints between the bump electrodes 15 and the second redistribution pattern 35 by providing a route for escape of air, and by allowing the bump electrodes 15 to make vertical as well as horizontal contact with the second redistribution pattern 35. After the semiconductor device is mounted on a printed circuit board or card, the second redistribution pattern 35 helps absorb external stress applied to the bump electrodes 15, making the external electrical connections of the semiconductor device more reliable.

The second redistribution pattern 35 is deposited on the first redistribution pattern 10, so the combined thickness of the second redistribution pattern 35 and the first redistribution pattern 10 in the ninth embodiment is twice the thickness of the redistribution pattern in the first embodiment, thereby providing a WCSP semiconductor devices with improved electrical properties and higher added value.

The positive photoresist mask used to form the first redistribution pattern 10 is left in place after the first redistribution pattern 10 is formed and is patterned by one more exposure to light, defining the second redistribution pattern 35, so it is only necessary to deposit the photoresist material once. WCSP semiconductor devices according to the ninth embodiment can accordingly be fabricated efficiently and the indirect material cost can be reduced.

As described above, in the ninth embodiment, a second redistribution pattern is deposited on the first redistribution pattern. The front surface of the semiconductor device is sealed by a protective layer having openings exposing parts of the second redistribution pattern, including extension parts. The openings are covered by bump electrodes that are electrically coupled to the parts of the second redistribution pattern disposed within the openings. This structure enables the thickness of the protective layer (the package layer in a wafer level chip size package) to be reduced because the electrodes are connected directly to the top surfaces and edges of the second redistribution pattern. The protective layer may comprise a photosensitive material, which simplifies the formation of the openings for the electrodes. The combined thickness of the first and second redistribution patterns in the ninth embodiment is twice the thickness of the redistribution pattern in the first embodiment, thereby providing WCSP semiconductor devices with improved electrical properties and higher added value.

The invention is not limited to the embodiments described above; those skilled in the art will recognize that further variations are possible within the scope of the invention, which is defined in the appended claims.

What is claimed is:

1. A method of forming a semiconductor device from a semiconductor wafer including a semiconductor substrate having a first surface, a second surface opposite the first surface, and a circuit element formed on the first surface, the method comprising:
   forming an electrode pad disposed on the first surface of the semiconductor substrate, electrically coupled to the circuit element;
   forming an interlayer dielectric film on the first surface of the semiconductor substrate, the interlayer dielectric film having a through hole extending to the electrode pad, the through hole having an inner wall;
   forming a first metal layer on the electrode pad and on the interlayer dielectric film, including the inner wall of the through hole;
   forming a first conductive pattern on the first metal layer;
   forming a protective layer sealing the first-surface side of the semiconductor substrate, the protective layer having an opening exposing part of the first conductive pattern;
   forming a bump electrode covering said opening, the bump electrode being electrically coupled to the exposed part of the first conductive pattern; and
   forming a conductive nub disposed on the first metal layer below the opening in the protective layer,
   wherein the first conductive pattern includes a first part formed on the conductive nub and projecting from the opening in the protective layer, a second part formed in the through hole, and a third part formed on the interlayer dielectric film to link the first and second parts, and the bump electrode is formed on the first part of the first conductive pattern.

2. The method of claim 1, further comprising:
   coating the first metal layer with a layer of positive photoresist material before forming the conductive nub;
   patterning the layer of photoresist material by exposure to light and chemical development to form a photoresist mask having an opening for formation of the conductive nub, the conductive nub then being formed within the opening in the photoresist mask;
   further patterning the photoresist mask by exposure to light and chemical development to enlarge the opening therein, thereby creating an enlarged opening for formation of the first conductive pattern, the first conductive pattern then being formed in the enlarged opening; and
   removing the photoresist mask after formation of the first conductive pattern, before formation of the protective layer.

3. The method of claim 1, further comprising:
   forming a barrier metal layer covering all surfaces of the first conductive pattern except a surface of contact between the first conductive pattern and the first metal layer; wherein
   the bump electrode is formed on a part of the barrier metal layer covering the first part of the first conductive pattern.

4. The method of claim 3, wherein the barrier metal layer contains at least one metal selected from the group consisting of nickel, palladium, gold and mixtures thereof.

5. The method of claim 3, wherein the barrier metal layer is formed by an electro-deposition process.

6. The method of claim 1, further comprising:
   coating the first metal layer with a layer of positive photoresist material before forming the conductive nub;
   patterning the layer of photoresist material by exposure to light and chemical development to form a photoresist mask having an opening for formation of the conductive nub, the conductive nub then being formed within the opening in the photoresist mask;
   further patterning the photoresist mask by exposure to light and chemical development to enlarge the opening therein, thereby creating an enlarged opening for formation of the first conductive pattern, the first conductive pattern then being formed in the enlarged opening;
   patterning the photoresist mask still further by exposure to light and chemical development to enlarge the opening therein once again, thereby removing the photoresist material from an area surrounding the first conductive pattern;
   forming a barrier metal layer in the twice enlarged opening in the photoresist mask, the barrier metal layer covering all surfaces of the first conductive pattern except a surface of contact between the first conductive pattern and the first metal layer; and
   removing the photoresist mask after formation of the barrier metal layer, before formation of the protective layer; wherein
   the bump electrode is formed on a part of the barrier metal layer covering the first part of the first conductive pattern.

7. The method of claim 1, further comprising:
   forming a second conductive pattern on the first conductive pattern before forming the protective layer; wherein
   the first conductive pattern has an edge disposed within the opening in the protective layer;

the second conductive pattern covers said edge of the first conductive pattern and has an extension extending from said edge of the first conductive pattern;

the opening in the protective layer also exposes the extension of the second conductive pattern; and the bump electrode is also formed on the extension of the second conductive pattern.

8. The method of claim 1, wherein the conductive nub is made of a same material as the first metal layer.

9. The method of claim 1, wherein the conductive nub is a cylindrical projection.

10. The method of claim 1, wherein the interlayer dielectric film is made from photosensitive resin.

11. The method of claim 1, wherein the protective layer is made from photosensitive resin.

* * * * *